(12) United States Patent
He

(10) Patent No.: US 7,921,402 B2
(45) Date of Patent: Apr. 5, 2011

(54) FPGA CIRCUITS AND METHODS CONSIDERING PROCESS VARIATIONS

(75) Inventor: Lei He, Pasadena, CA (US)

(73) Assignee: The Regents of the University of California, Oakland, CA (US)

( * ) Notice: Subject to any disclaimer, the term of this patent is extended or adjusted under 35 U.S.C. 154(b) by 549 days.

(21) Appl. No.: 11/965,483

(22) Filed: Dec. 27, 2007

(65) Prior Publication Data

US 2008/0178130 A1 Jul. 24, 2008

Related U.S. Application Data

(63) Continuation of application No. PCT/US2006/025796, filed on Jun. 30, 2006.

(60) Provisional application No. 60/696,046, filed on Jul. 1, 2005.

(51) Int. Cl.
*G06F 17/50* (2006.01)

(52) U.S. Cl. ........ 716/136; 716/111; 716/117; 716/128; 703/16

(58) Field of Classification Search ........ 716/5, 16, 716/18; 703/16
See application file for complete search history.

(56) References Cited

U.S. PATENT DOCUMENTS

| | | | |
|---|---|---|---|
| 5,329,470 A | | 7/1994 | Sample et al. |
| 5,557,531 A | | 9/1996 | Rostoker et al. |
| 5,801,958 A | | 9/1998 | Dangelo et al. |
| 6,345,379 B1 * | 2/2002 | Khouja et al. | 716/4 |
| 6,604,228 B1 * | 8/2003 | Patel et al. | 716/8 |
| 6,631,510 B1 * | 10/2003 | Betz et al. | 716/16 |
| 6,785,873 B1 | 8/2004 | Tseng | |
| 6,920,621 B1 * | 7/2005 | Toutounchi et al. | 716/4 |
| 6,993,737 B1 * | 1/2006 | Anderson et al. | 716/5 |
| 7,051,313 B1 * | 5/2006 | Betz et al. | 716/17 |
| 7,080,341 B2 * | 7/2006 | Eisenstadt et al. | 716/13 |
| 7,131,089 B2 * | 10/2006 | Issa et al. | 716/6 |
| 7,210,115 B1 * | 4/2007 | Rahim et al. | 716/16 |
| 7,366,997 B1 * | 4/2008 | Rahmat et al. | 716/1 |
| 7,441,211 B1 * | 10/2008 | Gupta et al. | 716/2 |
| 7,603,638 B2 * | 10/2009 | Haeussler et al. | 716/4 |
| 2002/0188432 A1 | 12/2002 | Houlihane et al. | |
| 2005/0091629 A1 * | 4/2005 | Eisenstadt et al. | 716/13 |
| 2005/0273742 A1 * | 12/2005 | Issa et al. | 716/6 |
| 2006/0277509 A1 * | 12/2006 | Tung et al. | 716/5 |
| 2008/0168406 A1 * | 7/2008 | Rahmat et al. | 716/2 |

OTHER PUBLICATIONS

Ayala-Rincon et al., "Modeling and Prototyping Dynamically Reconfigurable Systems for Efficient Computation of Dynamic Programming Methods by Rewritting-Logic", 17th Symposium on Integrated Circuits and Systems Design, Sep. 7-11, 2004, pp. 248-253.*
Rose et al., "Architecture of Field-Programmable Gate Arrays", Proceedings of the IEEE, vol. 81, No. 7, Jul. 1993, pp. 1013-1029.*
Siemers et al., "Modelling Programmable Logic Devices and Reconfigurable, Mircroprocessor-Related Architectures", 2003 Proceedings of International Parallel and Distributed Processing Symposium, Apr. 22-26, 2003, 7 pages.*

* cited by examiner

*Primary Examiner* — Phallaka Kik
(74) *Attorney, Agent, or Firm* — John P. O'Banion

(57) ABSTRACT

Methods are described herein which consider both die-to-die and within-die variations in effective channel length, threshold voltage, and gate oxide thickness, based on first developing closed-form models of chip level FPGA leakage and timing variations. Execution times are significantly reduced using these methods in comparison to performing detailed evaluation. The teachings provide mean and standard deviation which were found to be within 3% from those computed by Monte Carlo simulation, while leakage and delay variations can be up to 3x and 1.9x, respectively. Analytical yield models are derived which consider both leakage and timing variations, and use such models to evaluate FPGA device and architecture in response to process variations. The teachings allow improved modeling of leakage and timing yields and thus co-optimization to improve yield rates.

31 Claims, 10 Drawing Sheets

FPGA CIRCUITS AND METHODS CONSIDERING PROCESS VARIATIONS

CROSS-REFERENCE TO RELATED APPLICATIONS

This application claims priority from, and is a 35 U.S.C. §111(a) continuation of, co-pending PCT international application serial number PCT/US2006/025796, filed on Jun. 30, 2006, incorporated herein by reference in its entirety, which claims priority from U.S. provisional application Ser. No. 60/696,046 filed on Jul. 1, 2005, incorporated herein in its entirety.

STATEMENT REGARDING FEDERALLY SPONSORED RESEARCH OR DEVELOPMENT

This invention was made with Government support under Grant No. 0306682 awarded by the National Science Foundation. The Government has certain rights in this invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to FPGA circuits, and more particularly to methods and circuits for adapting FPGA architecture in response to levels of anticipated process variation.

2. Description of Related Art

Modern VLSI design is significantly impacted from process variation as devices scale down to nanometer technologies. Variability in effective channel length, threshold voltage, and gate oxide thickness introduces uncertainties in both chip performance and power consumption. For example, measured variation in chip-level leakage can be as high as 20× compared to the nominal value for high performance microprocessors. In addition to meeting the performance constraint under timing variation, dice with excessively large leakage due to such a high variation have to be rejected to meet the given power budget.

Recent work has studied parametric yield estimation for both timing and leakage power. Statistical timing analysis considering path correlation has been studied, and both non-Gaussian and non-linear variation models introduced. In addition, timing yield estimation has been discussed in the art. As devices scale down, leakage power becomes a significant component of total power consumption and it is significantly affected by process variation. Numerous investigations into parametric yield have considered both leakage and timing variations. Power minimization by gate sizing and threshold voltage assignment under timing yield constrains have been studied. However, these studies focus on ASICs and do not consider these aspects with regard to other devices, specifically field programmable gate arrays (FPGA) devices.

A small number of recent papers have studied FPGA power modeling and optimization. In one study the leakage power of a commercial FPGA architecture was quantified, and in another a high level FPGA power estimation methodology was presented. Power evaluation frameworks were introduced for generic parameterized FPGA in a number of studies while it has been shown that both interconnect and leakage power are significant for FPGAs in nanometer technologies. Power optimization for FPGAs have also been studied. Region based power gating for FPGA logic blocks and fine grained power-gating for FPGA interconnects have been proposed, and $V_{dd}$ programmability has been applied to both FPGA logic blocks and interconnects. Architecture evaluation has been performed first using the metrics of area and delay. For non-clustered FPGAs, it was shown that using lookup tables (LUT) with four input terms (LUT size of 4) achieves the smallest area and a LUT size of 5 or 6 leads to the best performance. Later on, the cluster-based island style FPGA was studied using the metric of area-delay product which indicated that LUT sizes ranging from 4 to 6 and cluster sizes between 4 and 10 can produce the best area-delay product. Besides area and delay, FPGA architecture evaluation considering energy was recently studied. In that study it was shown that in 0.35 µm technology, a LUT size of 3 consumes the smallest energy. In 100 nm technology, a LUT size of 4 consumes the smallest energy and a LUT size of 7 leads to the best performance. Another investigation further evaluated the architecture for the FPGAs with field programmable dual-$V_{dd}$ and power gating considering area, delay, and energy. A most recent work showed that device and architecture co-optimization is able to obtain the largest improvement in FPGA performance and power efficiency. Compared to the baseline, device and architecture co-optimization can reduce energy-delay product by 18.4% and chip area by 23.3%.

However, all the above FPGA power and delay evaluation work is involved with deterministic value and does not consider process variations.

Although FPGA architectures are characterized with substantial regularity, and thus less subject to process variation than ASICs, the parametric yield for FPGAs is still in need of study.

Accordingly, a need exists for FPGA circuit architectures and methods for improving leakage yield and timing yield in response to analyzing process variations. These needs and others are met within the present invention, which overcomes the deficiencies of previously developed FPGA circuit architectures and methods.

BRIEF SUMMARY OF THE INVENTION

Process variations in nanometer technologies are becoming an important issue for cutting-edge FPGAs with multi-million gate capacities.

Circuits and methods are described herein which consider both die-to-die and within-die variations in effective channel length, threshold voltage, and gate oxide thickness, based on first developing closed-form models of chip level FPGA leakage and timing variations. Experiments on these teachings show that the mean and standard deviation computed by the models discussed herein are within 3% from those computed by using a Monte Carlo simulation. It is also observed that leakage and delay variations can be up to 3× and 1.9×, respectively. Analytical yield models are taught herein which consider both leakage and timing variations, and use such models to evaluate FPGA device and architecture in response to process variations. Compared to the baseline, which uses the VPR architecture model and the same LUT size and cluster size as those used by the Xilinx Virtex-II, device setting from ITRS roadmap, architecture tuning alone improves leakage yield by 12% and device and architecture co-optimization increases leakage yield by 39%. In the work herein, it was also observed that a LUT size of 4 provided the highest leakage yield, with a LUT size of 7 providing the highest timing yield, while a LUT size of 5 achieved a maximum for combined leakage and timing.

The invention is amenable to being embodied in a number of ways, including but not limited to the following descriptions.

One embodiment of the invention can be generally described as a method of modeling a field programmable gate array (FPGA) subject to process variation, comprising: (a) collecting trace-based architecture information for one device setting of an FPGA; and (b) obtaining FPGA performance and power distribution for a given set of device and architectural parameter values based on the trace-based information. The trace based information is dependent on FPGA architecture, while performance and power distribution are dependent on performance parameters for the FPGA elements.

The FPGA architecture is configured with parameters selected from the group of parameters consisting of: number of used circuit elements of a given type, total number of circuit elements of a given type, average switching activity for circuit elements of a given type, number of circuit elements on the critical path of a given type, and ratio between short circuit power and switch power. By way of example, the FPGA performance and power parameters can be selected from the group of device parameters consisting of: power supply voltage, threshold voltage, average leakage power for a circuit element of a given type, average load capacitance for a circuit element of a given type, and average delay for a circuit element of a given type.

The evaluation of leakage and/or timing considers that each element has unique location variations while elements within a die share global variations.

Described within the teachings of the present invention are a number of inventive aspects, including but not necessarily limited to the following.

An aspect of the invention is to provide FPGA device and architecture evaluations which take process variations into account.

Another aspect of the invention is to eliminate the need to run full FPGA traces to evaluate each of multiple performance-dependent element aspects.

Another aspect of the invention is to divide FPGA device evaluation into multiple classes of information.

Another aspect of the invention is to divide FPGA device evaluation into architecture-dependent or performance-dependent parameters.

Another aspect of the invention is to perform evaluation in response to a limited trace collection, based on a subset of performance-dependent criterion, followed by trace-based estimations which take into account element performance.

Another aspect of the invention is to provide FPGA device and architecture evaluation which takes into account process variations, such as, but not limited to, channel length, threshold voltage, and gate oxide thickness.

Another aspect of the invention is to provide FPGA evaluation in which process variation is divided into local element variation and global element variations.

Another aspect of the invention is to provide FPGA device and architecture evaluation which takes into account power gating of unused elements.

Another aspect of the invention is to provide FPGA device and architecture evaluation in which leakage and timing yields are estimated based on benchmarks executed within multiple architecture classes.

Another aspect of the invention is to provide FPGA device and architecture evaluation in which multiple architecture classes are considered which comprise: Homo-$V_t$, Hetero-$V_t$, and Homo-$V_t$+G (which accounts for power gating).

Another further aspect of the invention is to provide device co-optimization to improve yield rate as based on FPGA device and architecture evaluation.

A still further aspect of the invention is to create a model from which leakage yield and timing yield of an FPGA can be improved.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

Referring more specifically to the drawings, for illustrative purposes the present invention is embodied in the method generally shown in FIG. 4 through FIG. 9. It will be appreciated that the method may vary as to the specific steps and sequence, without departing from the basic concepts as disclosed herein.

One aspect of the present invention involves the development of closed-form models of chip level leakage and timing variations considering both die-to-die and within-die variations. Based on such formula, we extend the Trace-based FPGA power and delay estimator (in short Ptrace) to estimate the power and delay variation of FPGAs. Experiments show that the mean and standard deviation computed by our models are within 3% from those computed by Monte Carlo simulation. It is also observed in our tests that the leakage and delay variations can be up to 3× and 1.9×, respectively.

Another aspect of the present invention is that with the extended Ptrace, FPGA device and architecture evaluation is described which takes into account process variations. The evaluation requires the exploration of a number of variables, including the following: cluster size N, LUT size K, supply voltage $V_{dd}$, and threshold voltage $V_t$. For the teachings herein, N refers to cluster size and K refers to LUT size. The combinations of the above parameters is referred to herein as hyper-architecture. For comparison, we obtain the baseline FPGA hyper-architecture which uses a VPR architecture model and the same LUT size and cluster size as the commercial FPGAs used by Xilinx Virtex-II, and device setting from ITRS roadmap. Compared to this baseline, architecture tuning alone, according to the present invention, improves leakage yield by 12% while device and architecture co-optimization increases leakage yield by 39%. It is also observed herein that a LUT size of 4 provides the highest leakage yield, a LUT size of 7 providing the highest timing yield, while a LUT size of 5 maximizes the combination of leakage and timing yield.

1. Preliminary.

A. FPGA Architecture.

Figure 1B:
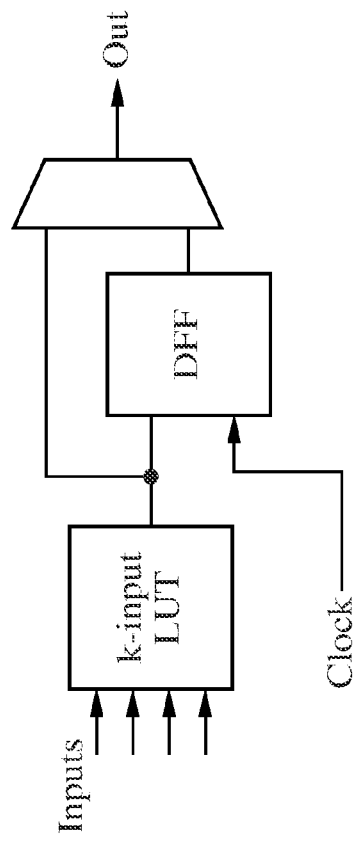
FIG. 1B is a schematic for a basic logic element of said cluster-based logic block of FIG. 1A.
Figure 1A:
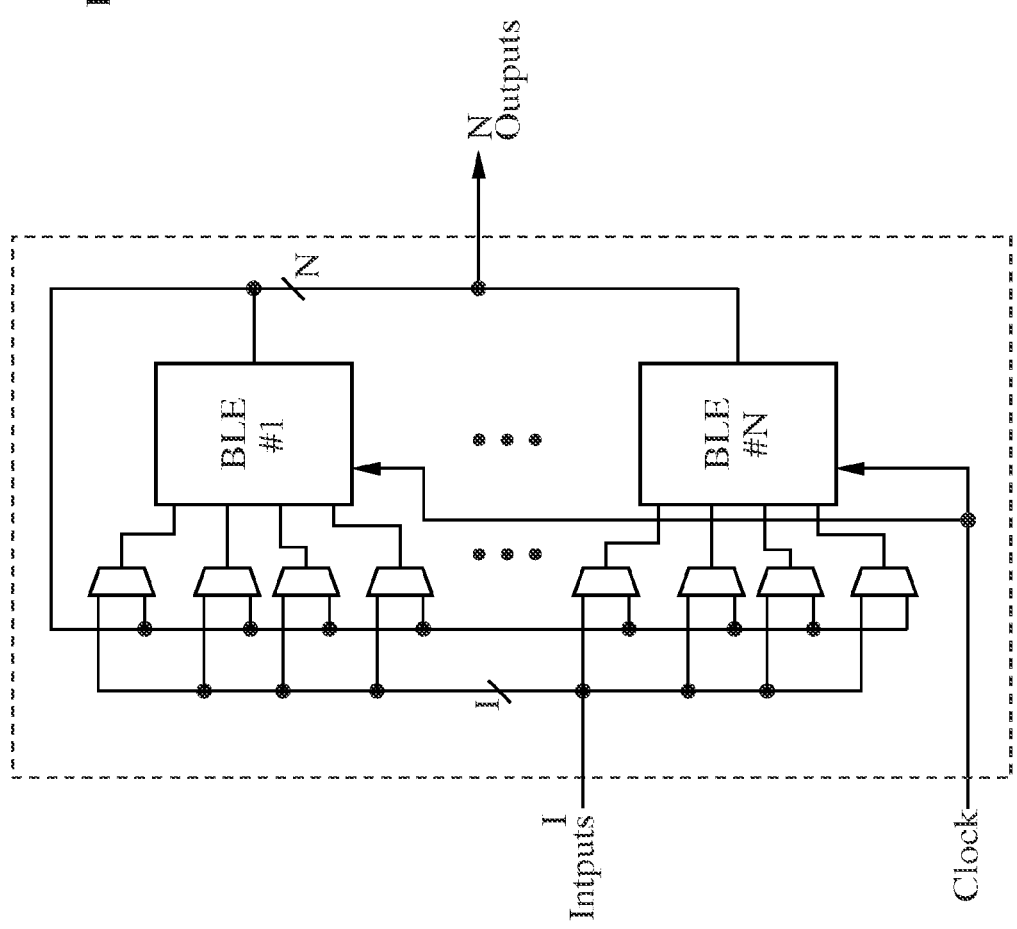
FIG. 1A is a schematic for a conventional cluster-based logic block.

FIG. 1A illustrates an embodiment of a cluster-based island style FPGA architecture, such as is assumed for all classes of FPGAs described herein.

The logic shown in the figure includes N fully connected basic logic elements (BLEs), with each BLE including one K-input lookup table (LUT) and one flip-flop, such as a data flip-flop (DFF). A combination of cluster size N and LUT size K=2 is the architectural parameter evaluated in this embodiment.

FIG. 1B illustrates a schematic for a basic logic element having a K input LUT, a flip-flop (DFF), and a multiplexer.

Figure 2B:
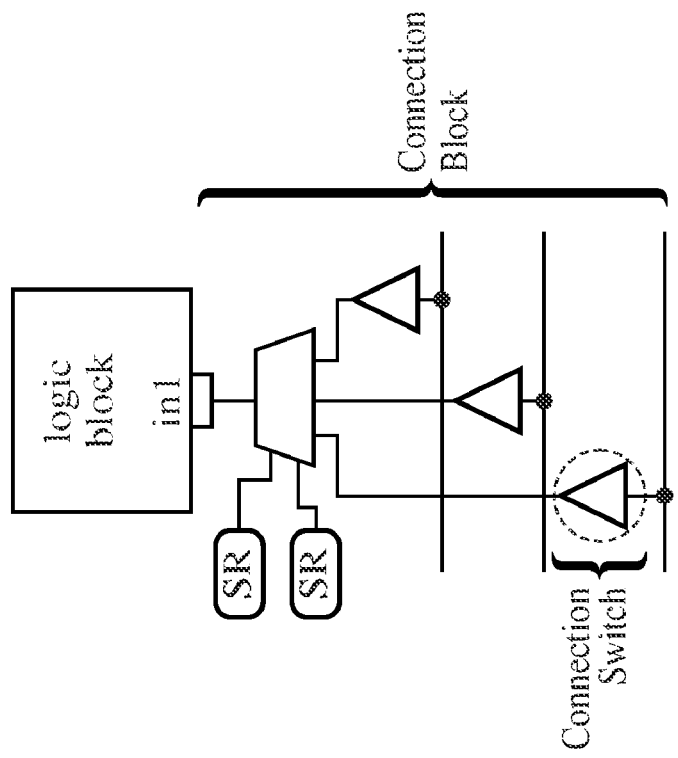
FIG. 2B is a block diagram of connecting a logic block with routing channels via a connection block.
Figure 2A:
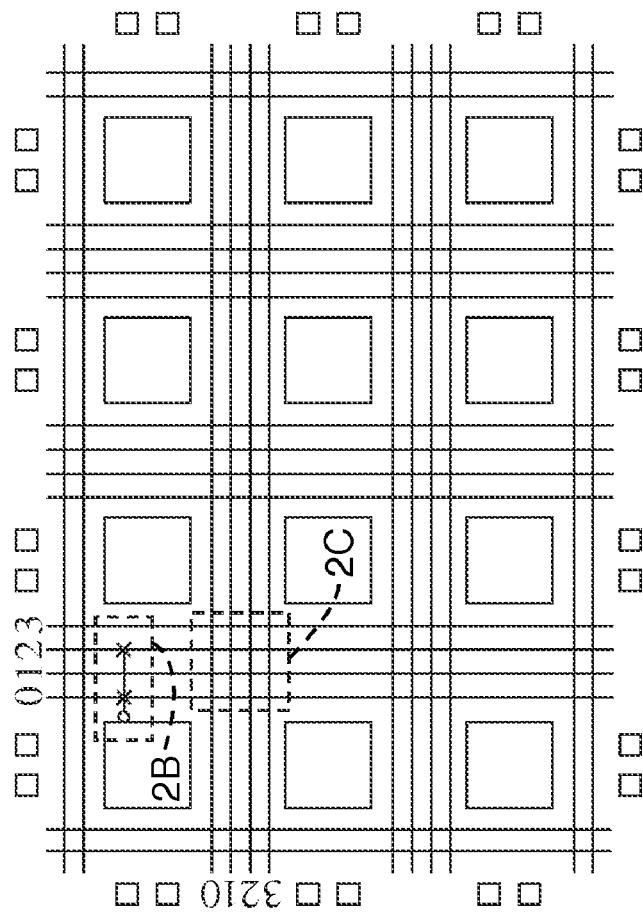
FIG. 2A is a block diagram exemplifying a conventional island-based routing architecture.
Figure 2D:
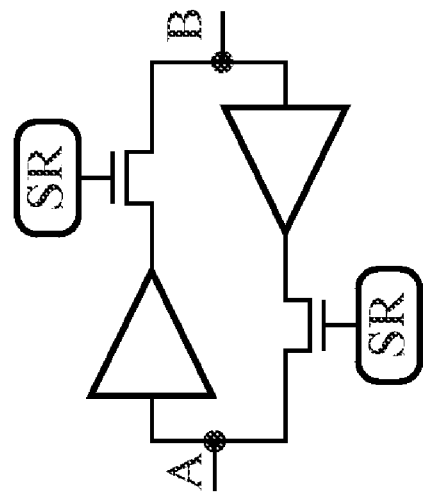
FIG. 2D is a schematic of conventional routing switches.
Figure 2C:
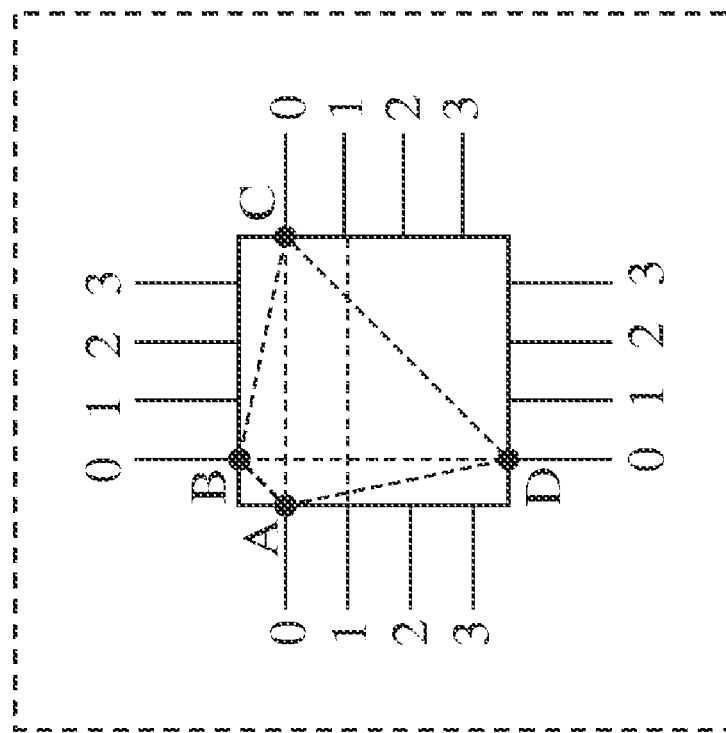
FIG. 2C is a routing diagram of a subset of a switch block for connecting an incoming track to the outgoing tracks with the same track number.

FIG. 2A-2D illustrate aspects of routing an FPGA. In FIG. 2A a routing structure of the island style FPGA architecture is shown in which the logic blocks are surrounded by routing channels consisting of wire segments. In FIG. 2B it is seen that the input and output pins of a logic block can be connected to the wire segments in routing channels via a connection block. A routing switch block is shown located at the intersection of a horizontal channel and a vertical channel. In FIG. 2C a subset switch block is shown configured for connecting incoming tracks to the outgoing tracks with the same track number. Without loss of generality, a subset switch block is assumed herein. The connections in a switch block, represented by the dashed lines in FIG. 2C are programmable routing switches which are implemented in this example by tri-state buffers with two tri-state buffers used for each connection so that it can be programmed independently for either direction. FIG. 2D illustrates an example of routing switches as may be used in the router channels of FIG. 2A. We define an interconnect segment as a wire segment driven by a tri-state buffer or a buffer. As used herein N refers to cluster size and K refers to LUT size. For simplify comparison and testing it is assumed that all wire segments span four logic blocks, which is the best routing architecture for low power FPGA. In this example the routing channel width CW can be decided in a conventional manner, for example CW=1.2 CWmin where CWmin is the minimum channel width required to route the given circuit successfully.

Power gating can be applied to interconnects and logic blocks to reduce FPGA power. For example, in one embodiment we insert a PMOS transistor (called a sleep transistor) between the power rail and the buffer (or logic block) to provide the power-gating capability. When a buffer or logic block is not used, the sleep transistor is turned off by the configuration cell. SPICE simulation shows that power-gating can reduce the leakage power of an unused buffer or a logic block by a factor of over 300.

B. Trace-based Power and Delay Model.

Because we consider two architecture parameters, cluster size N and LUT size K, and two device parameters, supply voltage $V_{dd}$ and threshold voltage $V_t$, the total number of hyper-architecture combinations can be easily over a few hundreds considering the interaction between these dimensions. previously we have proposed a runtime-efficient trace-based estimation tool, referred to herein as Ptrace to handle such co-optimization.

Figure 3:
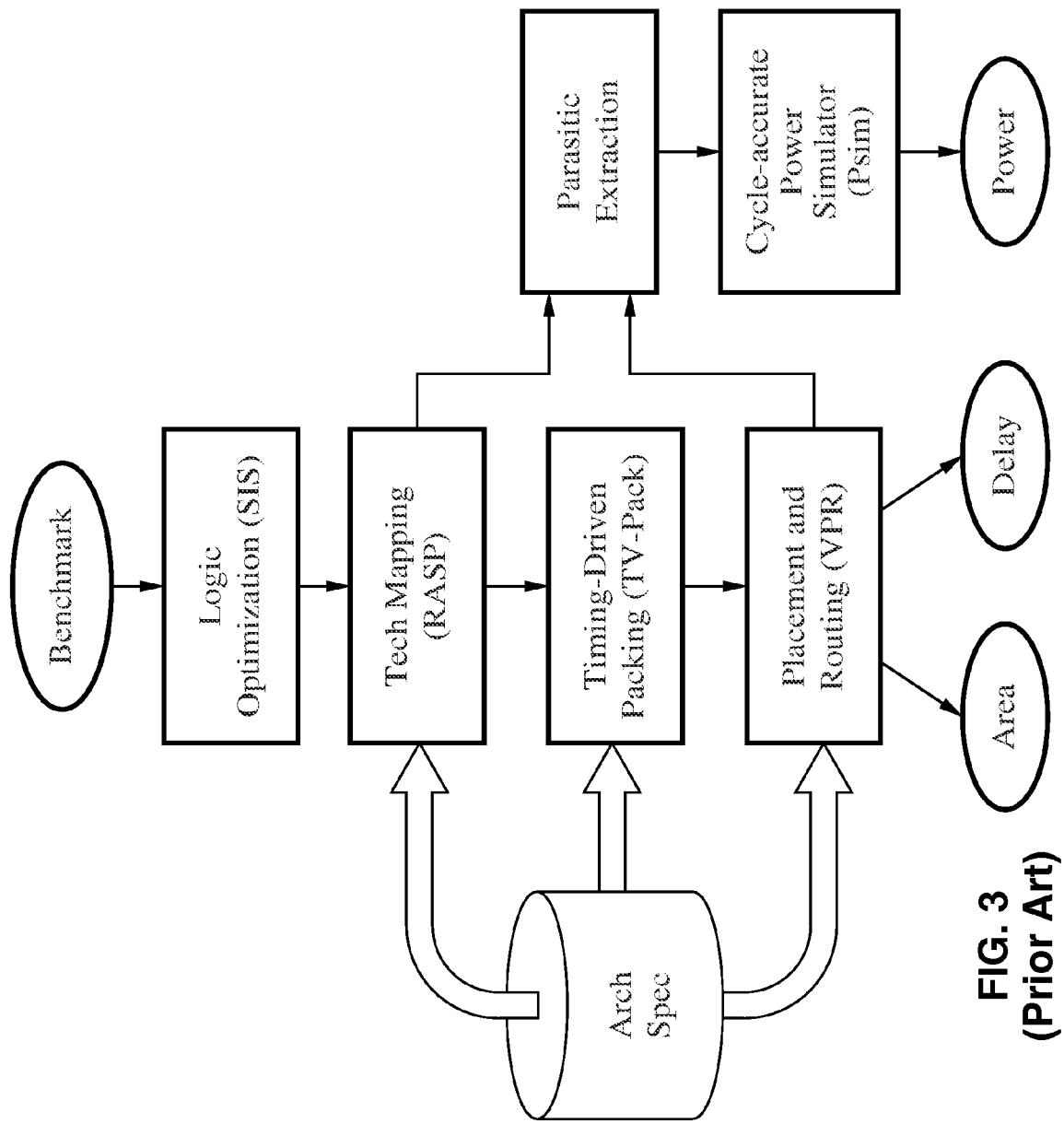
FIG. 3 is a flow diagram of a conventional FPGA architecture evaluation process configured for evaluated one specific device setting.

FIG. 3 illustrates the conventional FPGA architecture evaluation flow. Following the blocks of the figure, for a given benchmark set the logic was first optimized then the circuit mapped to a given LUT size. TV-Pack is used to pack the mapped circuit to a given cluster size. After packing, the circuit using VPR is placed and routed to obtain the chip level delay and area. VPR is defined in the book by V. Betz, J. Rose, and A. Marquardt entitled *"Architecture and CAD for Deep-Submicron FPGAs"*, by Kluwer Academic Publishers, February 1999. Finally, our cycle-accurate power simulator (in short Psim) is used to estimate the chip level power consumption. The architecture evaluation flow discussed above is time consuming because we need to place and route every circuit under different architectures and a large number of randomly generated input vectors need to be simulated for each circuit.

Figure 4:
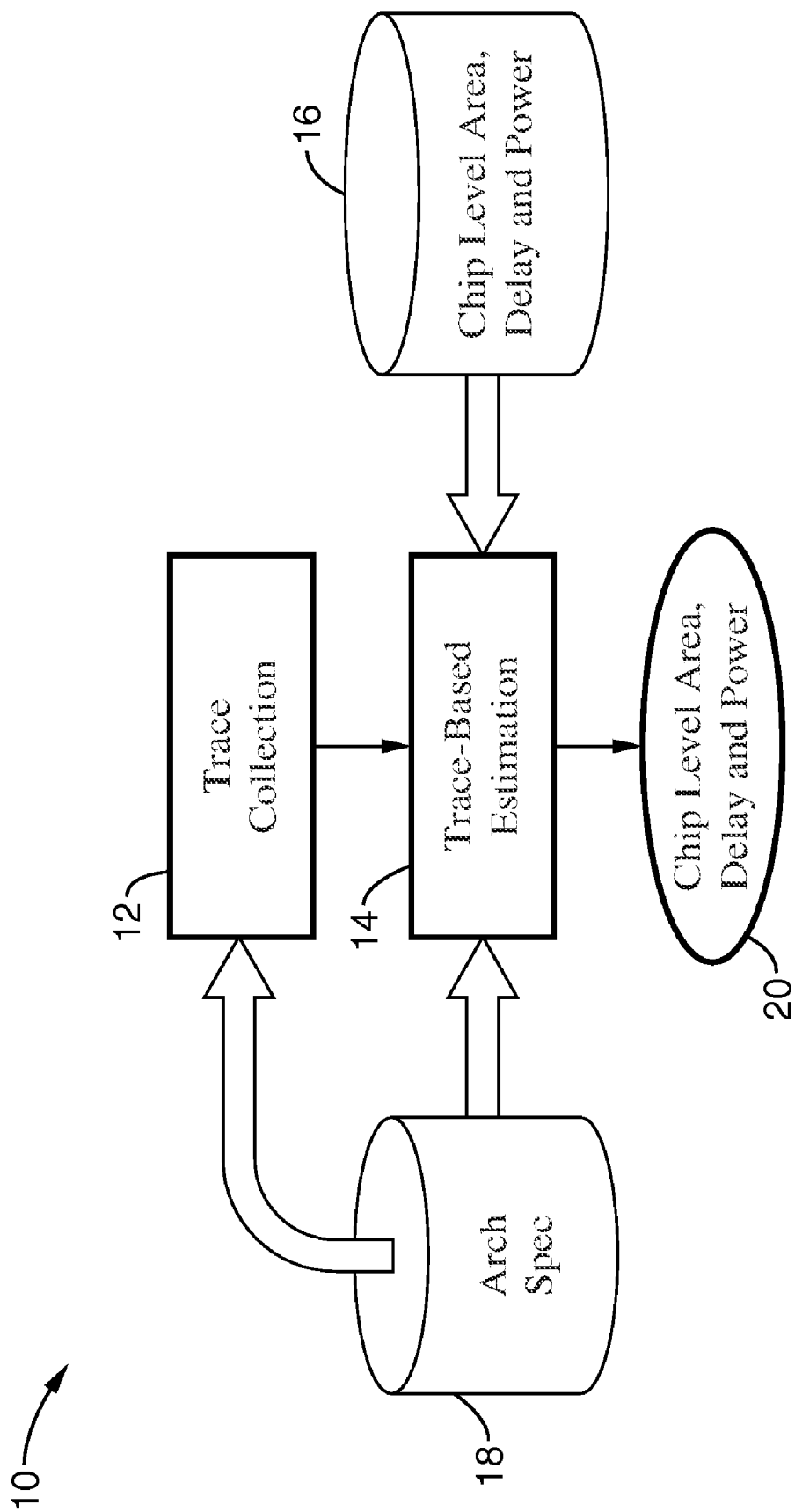
FIG. 4 is a flow diagram of a trace-based FPGA evaluation flow according to an aspect of the present invention.

FIG. 4 illustrates the steps involved in an evaluation embodiment 10 which utilizes Ptrace for co-optimization. The basic idea of using Ptrace in this manner is as follows: During hyper-architecture evaluation it is speculated that two classes of information exist, as illustrated in Table 1. The first class only depends on architecture and is called a trace of the architecture. The second class only depends on device setting and circuit design. For a given benchmark set, the placed and routed benchmark circuits are profiled and trace information collected under one device setting as represented by block 12. FPGA performance and power are then obtained as per block 14 for a given set of device and architectural parameter values based on the trace information. The estimation takes into account chip level area, delay and power as per block 16, as well as the architecture specification as per block 18. It should be appreciated that Ptrace has a high accuracy compared to the detailed evaluation, as discussed in relation to FIG. 3, where a circuit is placed and routed by VPR and simulated by cycle-accurate power simulation Psim.

Figure 5B:
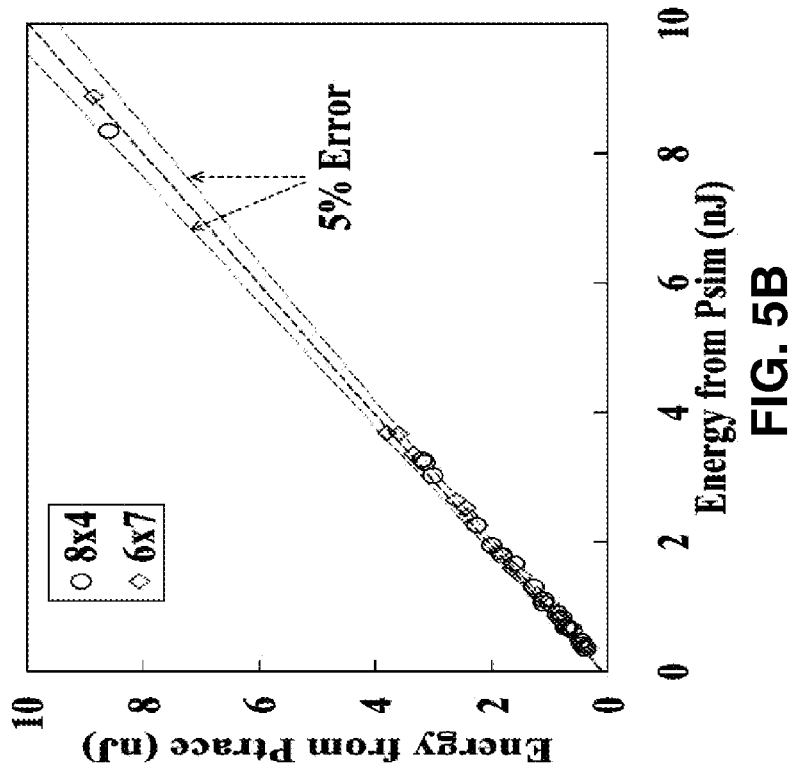
FIG. 5B is a plot comparing energy between Psim and Ptrace according to an aspect of the present invention.
Figure 5A:
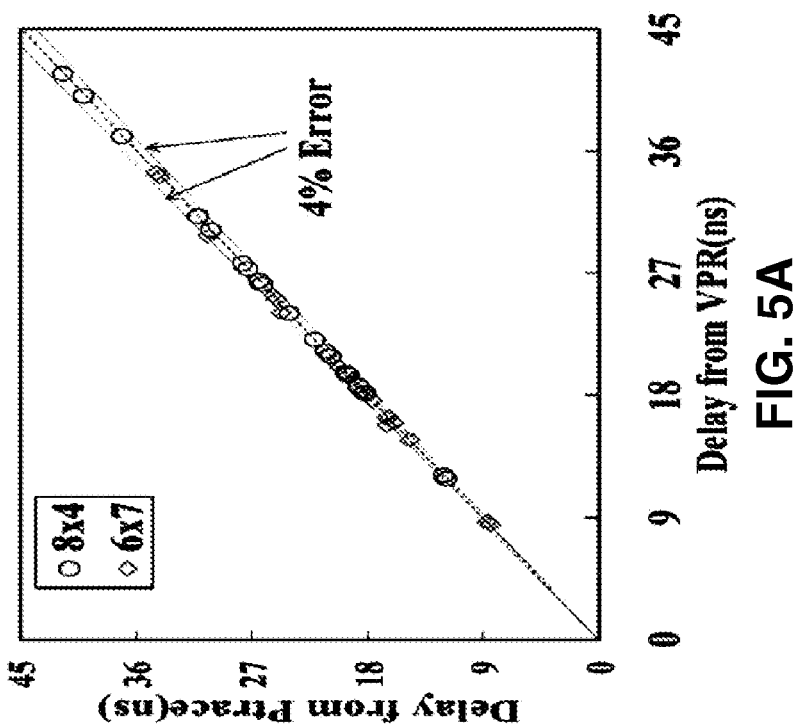
FIG. 5A is a plot comparing delays between Psim and Ptrace according to an aspect of the present invention.

FIGS. 5A and 5B illustrate energy and delay comparisons between Psim and Ptrace for each benchmark. The average energy error of Ptrace is 1.3% and the average delay error is 0.8%. From the figure, Ptrace has the same trend of energy and delay as Psim, the delay error is within 4% and the power error is within 5%. Therefore, Ptrace exhibits high fidelity while having a substantially reduced run-time, for example in this test the run time of Ptrace was 2 s, while the run time of Psim was 120 hours.

The variation in threshold voltage ($V_{th}$), effective channel length ($L_{eff}$) and gate oxide thickness ($T_{ox}$) are considered according to aspects of the invention. Each variation source is decomposed into global (die-to-die) variation and local (within-die) variation as follows:

$$\Delta P = \Delta P_g + \Delta P_l \quad (1)$$

where $\Delta P_g$ and $\Delta P_l$ are global and local variation, respectively. In the following section Ptrace is extended to consider the above variations and then perform device and architecture co-optimization with process variations.

2. Leakage And Timing Variations.

A. Leakage under Variation.

The leakage model in the FPGA power and delay estimation framework Ptrace is extended to consider variations. In Ptrace, the total leakage of an FPGA chip is calculated as follows:

$$\Delta P = \frac{\Delta P_g + \Delta P_l I_i}{i} \quad (2)$$

where i is the resource type such as an interconnect switch, buffer, LUT, configuration SRAM cell, or flip-flop, and $I_i$ is the leakage current of a type i circuit element. Different sizes of interconnect switches and buffers are considered as different circuit elements.

The leakage current $I_i$ of a circuit element i is the sum of the sub-threshold and gate leakages:

$$I_i = I_{sub} + I_{gate} \quad (3)$$

Variation in $I_{sub}$ mainly sources from variation in $L_{eff}$ and $V_{th}$. Variation in $I_{gate}$ mainly sources from variation in $T_{ox}$. This is different from conventional modeling, in which sub-threshold leakage and gate leakage is separately modeled. In our model, the total leakage current $I_i$ of circuit elements in resource type i is modeled as follows:

$$I_i = I_n(i) \cdot e^{fi(\Delta L_{eff})} \cdot e^{fi(\Delta V_{th})} \cdot e^{fi(\Delta T_{ox})} \quad (4)$$

where $I_n(i)$ is the leakage of a circuit element in resource type i in the absence of any variability and $f$ is the function that represents the impact of each type of process variation on leakage. The interdependency between these functions has been shown to be negligible in conventional modeling. From information collected from SPICE simulations, we believe sufficient accuracy is obtained from expressing these functions as simple linear functions. To make the presentation simple, we denote $\Delta L_{eff}$, $\Delta V_{th}$, and $\Delta T_{ox}$ as L, V, and T, respectively. We can express these functions with this simple notation as follows:

$$f(L) = -c_{i1} \cdot L \quad f(V) = -c_{i2} \cdot V \quad f(T) = -c_{i3} \cdot T \quad (5)$$

where $c_{i1}$; $c_{i2}$; $c_{i3}$ are fitting parameters obtained from SPICE simulations. The negative sign in the exponent indicates that the transistors with shorter channel length, lower threshold voltage, and smaller oxide thickness lead to higher leakage current. We rewrite Eq. 4 as follows by decomposing L, V and T in to local ($L_l$; $V_l$; $T_l$) and global ($L_g$; $V_g$; $T_g$) components.

$$I_i = I_n(i) \cdot e^{-(c_{i1}L_g + c_{i2}V_g + c_{i3}T_g)} \cdot e^{-(c_{i1}L_l + c_{i2}V_l + c_{i3}T_l)} \quad (6)$$

To extend the leakage model of Eq. 2 under variations, we assume that each element has unique local variations but all elements in one die share the same global variations. Both global and local variations are modeled as normal random variables. The leakage distribution of a circuit element is a lognormal distribution. The total leakage is the sum of all lognormals. The state-of-the-art FPGA chip usually has a large number of circuit elements, therefore the relative random variance of the total leakage due to local variation approaches zero. The Central Limit Theorem is applied and the mean of the distribution is used to approximate the distribution of the sum of lognormals. After integration, the expression of the chip-level leakage can be written as follows:

$$I_{chip} \approx \sum_i N_i^t \cdot E[I_i] \quad (7)$$

$$= \sum_i N_i^t S_i I_{L_g, V_g, T_g}(i)$$

$$S_i = e^{-(c_{i1}\sigma L_l^2 + c_{i2}\sigma V_l^2 + c_{i3}\sigma T_l^2)/2}$$

$$I_{L_g, V_g, T_g}(i) = I_n(i) e^{-(c_{i1}L_g + c_{i2}V_g + c_{i3}T_g)}$$

where $S_i$ is the scale factor introduced due to local variability in L, V, and T. Value $I_{L_g, V_g, T_g}(i)$ is the leakage as a function of global variations, while $\sigma_{L_l}$, $\sigma_{V_l}$, and $\sigma_{T_l}$ are the variances of $L_l$, $V_l$, and $T_l$, respectively.

For an FPGA architecture with power-gating capability, an unused circuit element can be power-gated to reduce leakage power. In this case, Ptrace calculates the total leakage current as follows:

$$I_{chip} = \sum_i N_i^u I_i + \alpha_{gating} \sum_i (N_i^t - N_i^u) I_i \quad (8)$$

where $N_i^u$ is the number of used circuit elements of resource type i and $\sigma_{gating}$ is the average leakage ratio between a power-gated circuit element and a circuit element in normal operation. A value of 1/300 is used herein for $\sigma_{gating}$, which can be easily extended to consider variations as follows:

$$I_{chip} \approx \sum_i N_i^u E[I_i] + \alpha_{gating} \sum_i (N_i^t - N_i^u) E[I_i] \quad (9)$$

where $E[I_i]$ is the expected average leakage for element type i.

B. Timing Under Variation.

The performance depends on $L_{eff}$, $V_{th}$, and $T_{ox}$ but its variation is primarily affected by $L_{eff}$ variation. Below the delay model in Ptrace is extended to consider global and local variations of $L_{eff}$. In Ptrace, the path delay is calculated as follows:

$$D = \sum_i d_i \quad (10)$$

where $d_i$ is the delay of the ith circuit element in the path. Considering process variation, the path delay is calculated as follows:

$$D = \sum_i d_i(L_g, L_l) \quad (11)$$

For circuit element i in the path, $d_i(L_g, L_l)$ is the delay considering global variation $L_g$ and local variation $L_l$. $L_g$ is the same for all the circuit elements in the critical path. Given $L_g$, a few points are evenly sampled (i.e., eleven in this example) within the range of $[L_g-3\sigma_{Ll}, L_g+3\sigma_{Ll}]$. SPICE simulations are then performed to obtain the delay for each circuit element with these variations. As the delay monotonically decreases when $L_{eff}$ increases, the probability of a channel length can be directly mapped to the probability of a delay to obtain the delay distribution of a circuit element. It is assumed that the local channel length variation of each element is independent from each other. Therefore, the PDF (probability density function) is obtained of the critical path delay for a given $L_g$ as follows by the convolution operation.

$$PDF(D|L_g) = PDF(d_1|L_g) \otimes PDF(d_2|L_g) \otimes \ldots \otimes PDF(d_i|L_g) \otimes \ldots \otimes PDF(d_n) \quad (12)$$

3. Yield Models.

A. Leakage Yield.

The leakage yield is calculated on a bin-by-bin basis where each bin corresponds to a specific value $L_g$. For a particular bin, the value $L_g$ is constant. We can rewrite Eq. 7 for chip-level leakage current as follows, $$I_{chip} = \sum_i A_i \cdot e^{-c_{i2}V_g} \cdot e^{-c_{i3}T_g} \quad (13)$$

$$A_i = N_i I_n(i) S_i e^{-c_{i1}L_g}$$

where $A_i$ is the leakage current for all circuit elements of resource type i at a value of $L_g$ and includes the scale factor $S_i$ due to the local variability. Let $X_i$ be the leakage consumed by the elements of resource type i which is a lognormal variable. The chip-level leakage current $I_{chip}$ is the sum of each lognormal variable $X_i$ and it can be expressed as follows, $$I_{chip} = \sum_i X_i \quad (14)$$

$$X_i \sim Lognormal(\log(A_i), ((c_{i2}\sigma V_g)^2 + (c_{i3}\sigma T_g)^2))$$

Following a conventional strategy, we model $I_{chip}$, the sum of the lognormal variables $X_i$, as another lognormal random variable. The lognormal variable $X_i$ shares the same random variables $\sigma_{Vg}$ and $\sigma_{Tg}$, and therefore these variables are dependent on each other. Considering the dependency, the mean and variance of the new lognormal $I_{chip}$ is calculated as follows, $$\mu I_{chip} = \sum_i \left\{ \exp\left[\log(A_i) + \left(\frac{(c_{i2}\sigma V_g)^2}{2} + \frac{(c_{i3}\sigma T_g)^2}{2}\right)\right]\right\} \quad (15)$$

$$\sigma I_{chip}^2 = \sum_i \left\{ \frac{\exp\left[\frac{2\log(A_i) +}{(c_{i2}\sigma V_g)^2 + (c_{i3}\sigma T_g)^2}\right] \cdot}{[\exp(c_{i2}^2\sigma_{Vg}^2 + c_{i3}^2\sigma_{Tg}^2) - 1]} \right\} + \sum_{i,j} 2COV(X_i, X_j) \quad (16)$$

where the mean of $I_{chip}$, $\mu I_{chip}$, is the sum of means of $X_i$, and the variance of $I_{chip}$, $\sigma I_{chip}$, is the sum of variance of $X_i$ and the covariance of each pair of $X_i$. The covariance is calculated as follows, $$COV(X_i, X_j) = E[X_i X_j] - E[X_i]E[X_j] \quad (17)$$

$$E[X_i X_j] = \exp\left[\log(A_i A_j) + \frac{(c_{i2}+c_{j2})^2 \sigma V_g^2}{2} + \frac{(c_{i3}+c_{j3})^2 \sigma T_g^2}{2}\right]$$

$$E[X_i] = \exp\left[\log(A_i) + \frac{(c_{i2}\sigma V_g)^2}{2} + \frac{(c_{i3}\sigma T_g)^2}{2}\right]$$

A method from R. Rao, A. Devgan and D. Blaauw, and D. Sylvester described in an article *"Parametric Yield Estimation Considering Leakage Variability"* from Proceedings of Design Automation Conference in June 2004 is used to obtain the mean and variance ($\mu_{N,I_{chip}}, \mu_{N,I_{chip}}^2$) of the normal random variable corresponding to the lognormal $I_{chip}$. As the exponential function that relates the lognormal variable $I_{chip}$ with the normal variable $I_{N,chip}$ is a monotonically increasing function, the CDF of $I_{chip}$ can be expressed as follows using the standard expression for the CDF of a lognormal random variable, $$\mu_{N,I_{chip}} = \frac{\log[\mu_{I_{chip}}^4 / (\mu_{I_{chip}}^2 + \sigma_{I_{chip}}^2)]}{2} \quad (18)$$

$$\sigma_{N,I_{chip}}^2 = \log[1 + (\sigma_{I_{chip}}^2 / \mu_{I_{chip}}^2)]$$

$$Y_{leak}(I_{chip}|L_g) = CDF(I_{chip})$$

$$= \frac{1}{2}\left[1 + \text{erf}\left(\frac{\log(I_{chip}) - \mu_{N,I_{chip}}}{\sqrt{2}\sigma_{N,I_{chip}}}\right)\right]$$

where erf( ) is the error function. Given a leakage limit $I_{cut}$ for $I_{chip}$, [CDF($I_{cut}$)×100%] gives the leakage yield rate $Y_{leak}(I_{cut}|L_g)$, for example, the percentage of FPGA chips that is smaller than $I_{cut}$ in a particular $L_g$ bin. Then the total leakage yield can be computed by integrating $Y_{leak}(I_{cut}|L_g)$ over $L_g$.

$$Y_{leak} = \int_{-\infty}^{+\infty} PDF(L_g) \cdot Y_{leak}(I_{cut}|L_g) \cdot dL_g \quad (19)$$

Similarly, the yield for the FPGA chip with power-gating capability can be easily calculated using the techniques described by S. Raj, S. B. Vrudhula, and J. Wang in the article *"A Methodology to Improve Timing Yield in the Presence of Process Variations"* published in the Proceedings of the Design Automation Conference in June 2004.

B. Timing Yield.

The timing yield is again calculated on a bin-by-bin basis where each bin corresponds to a specific value $L_g$. We further consider local variation of channel length in timing yield analysis. Given the global channel length variation $L_g$, the PDF of the critical path delay D of the circuit can be determined according to the article from A. Srivastava, S. Shah, K. Agarwal, D. Sylvester, D. Blaaue, and S. Director, entitled *"Impact of Process Variations on Power"* as published in Proceedings of the Design Automation Conference in June 2005. The CDF of delay, CDF(D|$L_g$), is obtained by integrating PDF(D|$L_g$). Given a cutoff delay ($D_{cut}$) and $L_g$, $Y_{leak}(I_{cut}|L_g)$ CDF(D|$L_g$) gives the probability that the path delay is smaller than $D_{cut}$ considering $L_{eff}$ variations. However, it is not sufficient to restrict analysis to the original critical path in the absence of process variations. The close-to-be critical paths may become critical considering variations and an FPGA chip that meets the performance requirement should consider the delay of all paths no greater than $D_{cut}$.

It is assumed that the delay of each path is independent, wherein we can calculate the timing yield for a given $L_g$ as follows, $$Y_{perf}(D_{cut} | L_g) = \prod_{i=1}^{n} CDF_i(D_{cut} | L_g) \quad (20)$$

where $CDF_i(D_{cut}|L_g)$ gives the probability that the delay of the ith longest path is no greater than $D_{cut}$. In the examples described herein, we only consider the ten longest paths, for example n=10 because the simulation result shows that the ten longest paths have already covered all the paths with a delay larger than 75% of the critical path delay under the nominal condition. We then integrate $Y_{perf}(D_{cut}|L_g)$ to calculate the performance yield $Y_{perf}$ as follows, $$Y_{perf} = \int_{-\infty}^{+\infty} PDF(L_g) \cdot Y_{leak}(I_{cut} | L_g) \cdot dL_g \quad (21)$$

C. Leakage and Timing Combined Yield.

To analyze the yield of a lot, we need to consider both leakage and delay limit. Given a specific global variation of channel length $L_g$, the leakage variability only depends on the variability of random variable $V_g$ and $T_g$ as shown in Eq. 7, and the timing variability only depends on the variability of random variable $L_l$. Therefore, we assume that the leakage yield and timing yield are independent of each other for a given $L_g$. The yield considering the imposed leakage and timing limit can be calculated as follows, $$Y_{com} = \int_{-\infty}^{+\infty} PDF(L_g) Y_{leak}(I_{cut} | L_g) Y_{perf}(D_{cut} | L_g) \cdot dL_g \quad (22)$$

4. Leakage and Timing Yield Analysis.

For the total power and leakage power we report the arithmetic mean of 20 MCNC benchmarks within and among three FPGA architecture classes: (1) Homo-$V_t$ is the conventional FPGA using the same and optimized $V_t$ for both logic blocks and interconnect; (2) Hetero-$V_t$ optimizes $V_t$ separately for logic blocks and interconnect; and (3) Homo-$V_t$+G is the same as Homo-$V_t$ except that unused logic blocks and interconnect are power-gated. It is assumed that 10% of the nominal value is $3\sigma$ for all the process variations.

A. Leakage Yield.

Figure 6:
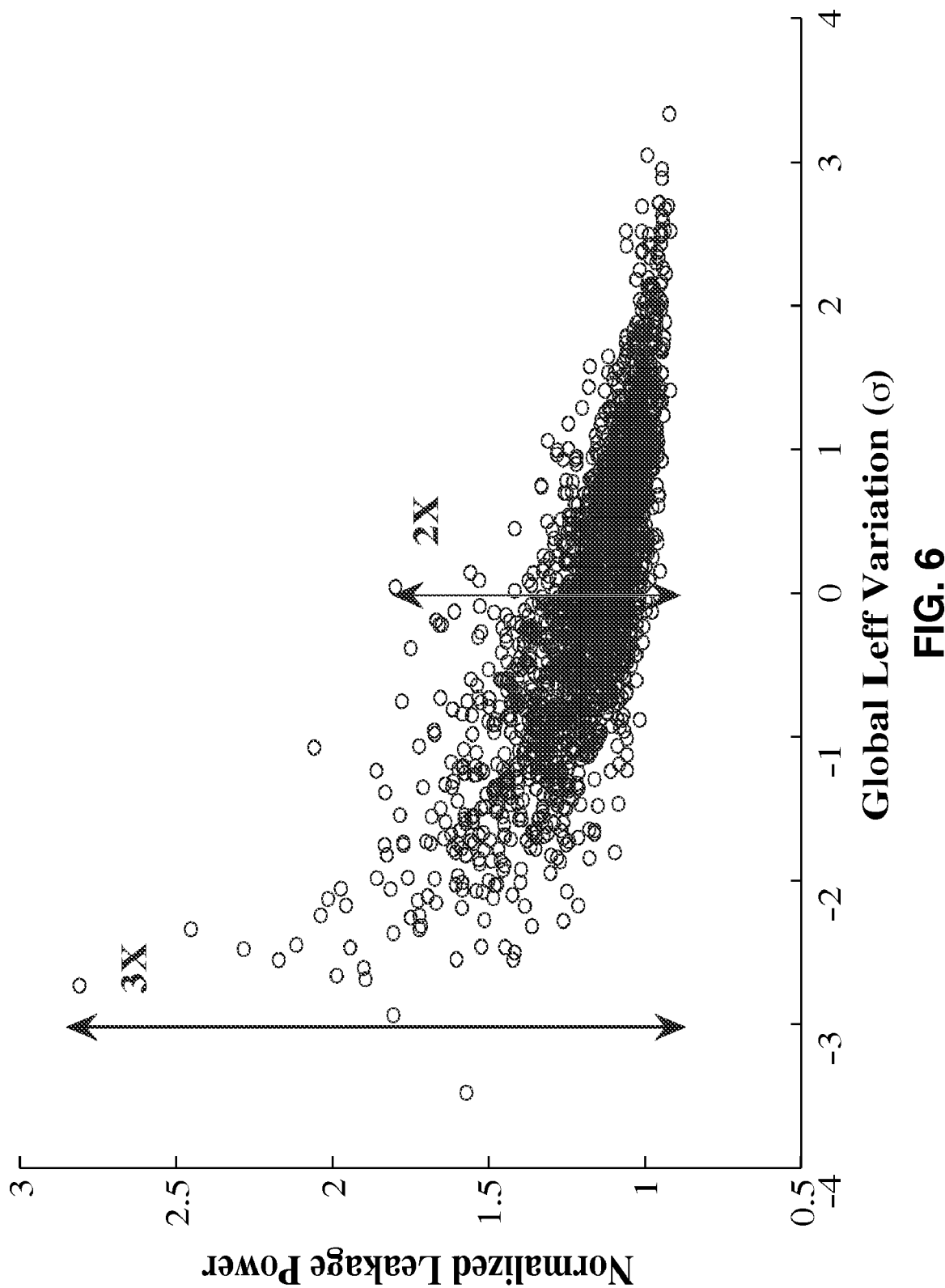
FIG. 6 is a plot of leakage power for a baseline architecture with ITRS device setting subject to intra-die and inter-die variations.

FIG. 6 shows the full chip leakage power simulated by Monte Carlo simulation and $\sigma$, in the presence of inter-die and intra-die variations. Leakage may change significantly due to process variations. When there is a $\pm 3\sigma$ inter-die variation of $L_{eff}$, $V_{th}$ and $T_{ox}$ the leakage power has a 3× span. When no variation of $L_{eff}$ is present, there is still a 2× span in leakage power due to $V_{th}$ and $T_{ox}$ variation. Therefore it is important to consider the impact of process variations on leakage when determining the yield.

Our chip-level analytical model is further validated for leakage by Monte Carlo simulation to estimate the full chip leakage power as seen in Table 2, where global variations are all set to $\pm 3\sigma$, and local variations are set to 0, $\pm 1\sigma$, and $\pm 2\sigma$. The mean calculated from our analytical method has less than 3% differences from the simulation and the standard deviations differ by 1% of the mean value. Hereafter, the standard deviation is reported as a relative value with respect to the mean and our analytical model is used to calculate the yield.

(1) Impact of Architecture and Device Tuning:

In this section we consider combinations of device and architecture parameters, called as hyper-architecture (in short, hyper-arch). Table 3 shows the yield, mean leakage, and standard deviation from two different device settings, sorted by the yield. Columns 1 to 4 use ITRS device setting. Our baseline FPGA has N=8 and K=4, which is the architecture used by Xilinx Virtex-II Pro. Yield is calculated using the nominal leakage of each architecture plus an offset of 30% of the nominal leakage of baseline architecture, PL base, as the leakage limit. As shown in column 1 of Table 3, the yield ranges from 24% to 70%, which shows that architecture tuning has a significant impact on the yield. Among all architectures, N=6 and K=5 gives the maximum yield, which is 12% higher than the baseline. The yield is affected by both the mean and variance. When the mean leakage is close to the leakage limit, the variance becomes important in determining the yield. However, when the mean is not close to the limit, the variance does not have that much impact on the yield. In this case, the lower the mean leakage is, the higher the yield is (see columns 5 to 8). It is also noticeable that larger LUT sizes have larger mean leakage, thus yield is reduced.

Device tuning also affects the yield. In Columns 5 to 8 of Table 3, we use a device setting that provides the minimum energy-delay product (minimum product of energy per clock cycle and critical path delay, in short, min-ED) as described in our work (L. Cheng, P. Wong, F. Li, Y. Lin and H. Le) in the article entitled "*Device and Architecture Co-Optimization for FPGA Power Reduction*" published in Proceedings of the Design Automation Conference of June 2005. Column 5 shows that optimizing $V_{dd}$ and $V_t$ can increase the yield rate by an average of 39%. Therefore, device tuning has a great impact on yield rate and it is important to evaluate different $V_{dd}$ and $V_t$ levels while considering process variations. Comparing the yield of architecture (12; 7) in ITRS device setting and architecture (6; 4) in Min-ED device setting shows that combining device tuning with architecture tuning can increase the yield by up to 73%. From the Table, architectures with K=4 generally provides the highest yield rate, and they have the minimum area as reported in previous work such as in the preceding article.

Hereafter, this discussion will only consider dominant architectures, which are defined as the group of architectures that either have a smaller delay or less energy consumption than others.

Figure 7:
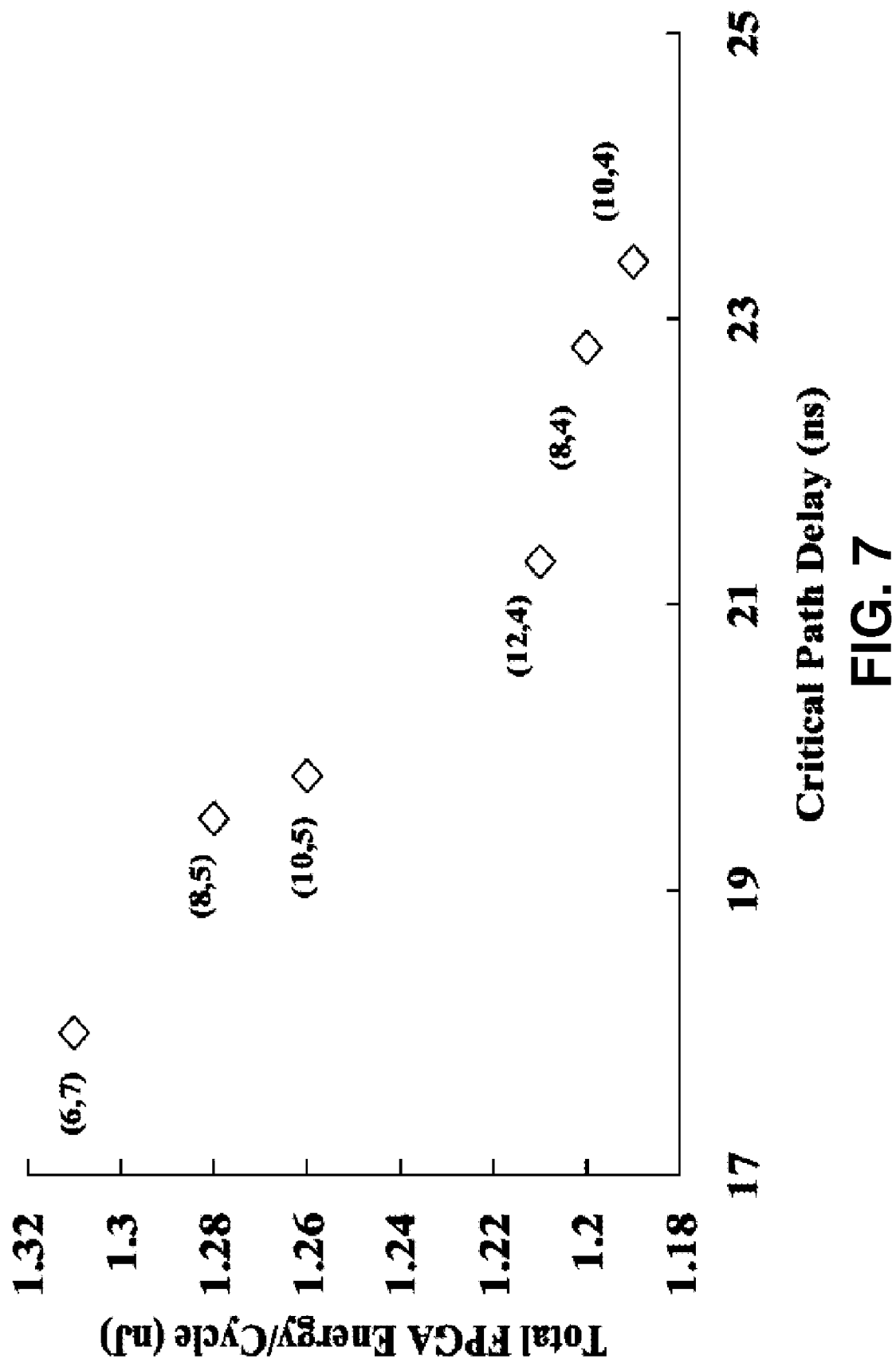
FIG. 7 is a plot of energy-delay tradeoff among architectures according to an aspect of the present invention.

FIG. 7 presents the energy and delay tradeoff between dominant architectures assuming Homo-$V_t$ class.

(2) Impact of Heterogeneous-$V_t$ and Power-Gating:

It has been shown in the above article that heterogeneous-$V_t$ and power-gating may have great impact on energy delay tradeoff. Here we further consider the impact of heterogeneous-$V_t$ on the yield by comparing Homo-$V_t$ and Hetero-$V_t$ in min-ED device setting. The above article also shows the results of the dominant architectures in all classes. The average yield for each class is presented in the last row of the table. Comparing the yield of Homo-$V_t$ and Hetero-$V_t$, we can see that the average yield is improved by 5% when applying different Vt for logic blocks and interconnects. Therefore, introducing heterogeneous-$V_t$ could improve yield with no or little area increase (due to an increase in doping well area).

Furthermore, power-gating can be applied to unused FPGA logic blocks and interconnects to reduce leakage power. As only one sleep transistor is used for one logic block, we use a 210×PMOS as the sleep transistor for each logic block. For interconnect, the area overhead associated with sleep transistors is more significant. Therefore a 2×PMOS transistor is used as the sleep transistor for each interconnect switch. Comparing the yield of Homo-$V_t$ and Homo-$V_t$+G in Table 4, applying power-gating was found to improve yield by 8%. Comparing the yield of Hetero-$V_t$ and Homo-$V_t$+G, power-gating can obtain more yield improvement than heterogeneous-$V_t$ at the cost of chip-level area overhead between 10% and 20%. As leakage power can be greatly reduced by power-gating, little benefit can be introduced by applying simultaneous heterogeneous-$V_t$ and power-gating, and those results will not presented here. Again, with heterogeneous-$V_t$ or power-gating, LUT size K=4 is the best for leakage yield rate.

B. Timing Yield.

For timing yield analysis, we only analyze the delay of the largest MCNC benchmark clma. Similarly, the timing yield is often studied using a selected test circuit such as a ring oscillator which is used for ASIC testing in the literature.

Figure 8:
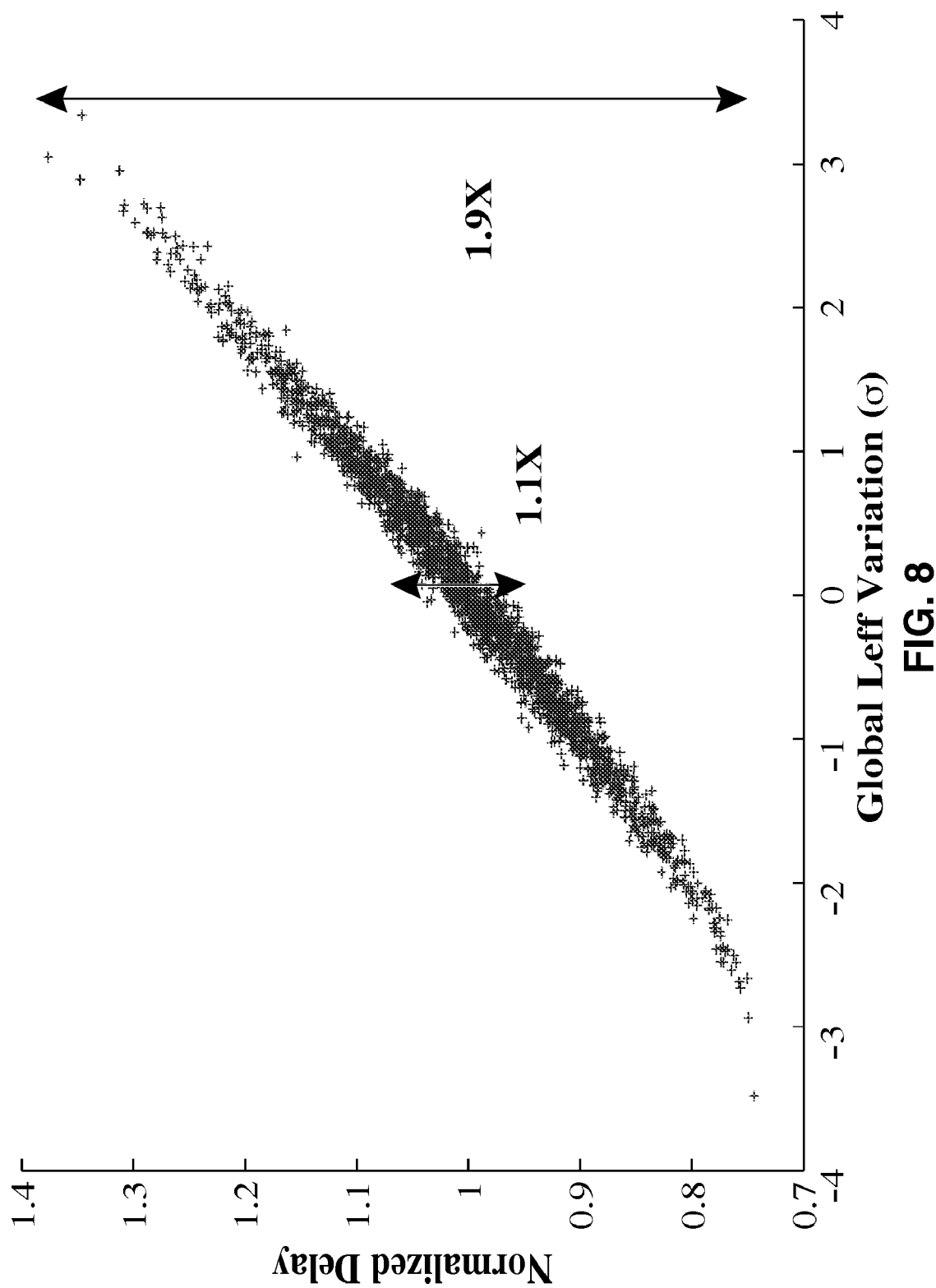
FIG. 8 is a plot of a baseline architecture with ITRS device settings subject to intra-die and inter-die variations.

FIG. 8 shows the delay with intra-die and inter-die channel length variation at baseline architecture (8, 4) with ITRS device setting. As shown in the figure, there is a 1.9× span with ±3σ $L_g$ variation, and a 1:1× span without $L_g$ variation. Clearly, delay is more sensitive to inter-die variation than within-die variation. This is because of the independence of local $L_{eff}$ variation between each element. Therefore the effect of within-die $L_{eff}$ variation tends to average out when the critical path is long enough.

For timing yield, dies with critical delay larger than the cutoff delay are discarded, which is 1:1× of the nominal critical path delay of each architecture. Table 5 shows the delay yield of Homo-$V_t$+G. One can see from this table that a larger LUT size will give a higher yield rate. This is because a larger LUT size generally gives a smaller mean delay with a shorter critical path, for example a smaller number of elements in the path, which leads to a smaller variance.

Therefore, a larger LUT size leads to a higher timing yield. As the timing specification may be relaxed for certain applications that are not timing critical, the cutoff delay may be relaxed in this case. In Table 5 is also shown the yield with the cutoff delay as 1:2× of the nominal delay. The yield rate under a higher cutoff still has the same trend as that under a lower cutoff. Note that the other architecture classes have similar trends on timing yield.

C. Leakage and Timing Combined Yield.

Figure 9:
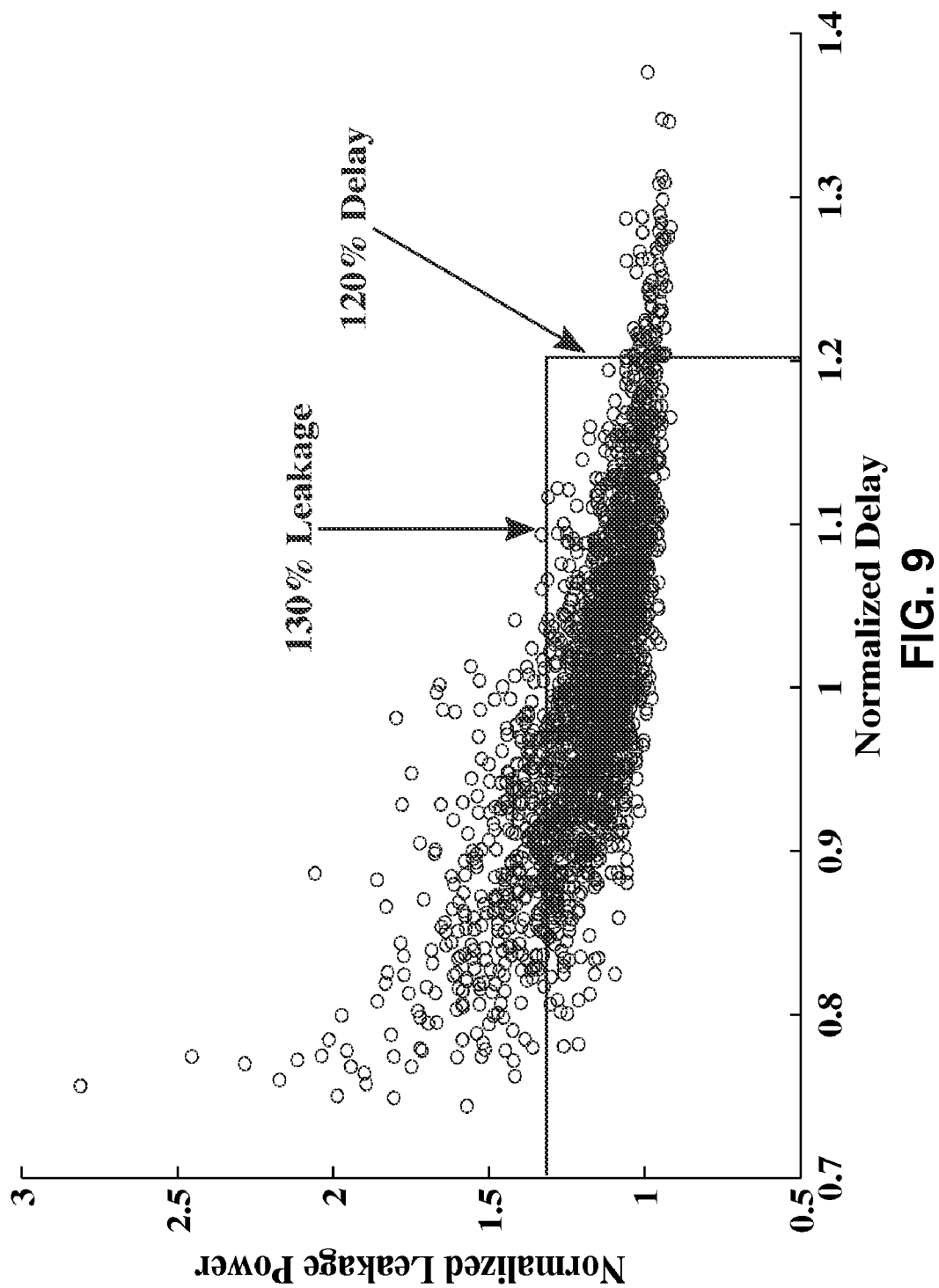
FIG. 9 is a plot of leakage and delay for a baseline architecture with ITRS setting subject to process variation.

FIG. 9 presents the leakage and delay variation for the baseline case using Monte Carlo simulation with Ptrace. It can be seen that a smaller delay leads to a larger leakage in general. This is because of the inverse correlation between circuit delay and leakage. A device with short channel length has a small delay and consumes large leakage, which may lead to a high leakage. To calculate the leakage and delay combined yield, we set the cutoff leakage as the nominal leakage plus 30% that of the baseline, while the cutoff delay is 1:2× of each architecture's nominal delay.

Table 6 presents the combined yield for Homo-$V_t$ with ITRS device setting and all classes with min-ED device setting. The area overhead introduced by power-gating is also presented in the table. Comparing Homo-$V_t$ with ITRS device setting and min-ED device setting, the combined yield is improved by 21%. Comparing the classes using min-ED device setting, Hetero-$V_t$ has a 3% higher yield than Homo-$V_t$ due to heterogeneous-$V_t$ while Homo-$V_t$+G has a 8% higher yield than Homo-$V_t$ due to power-gating. Homo-$V_t$+G has the highest combined yield with an average of 16% area overhead. Device tuning and power-gating improve yield by 29% comparing Homo-$V_t$+G with min-ED setting to Homo-$V_t$ with ITRS setting. Table 6 also shows that architectures with LUT size of 5 provide the highest yield within each class. This is because it has both a relatively high leakage yield as well as timing yield.

5. CONCLUSIONS

The present application has taught efficient models for chip level leakage variation and system timing variation within FPGAs. Experiments show that our models are within 3% from Monte Carlo simulation, and the FPGA chip level leakage and delay variations can be up to 3× and 1.9×, respectively. In addition, timing is more sensitive to die-to-die variations than intra-die variation. We have shown that architecture and device tuning has a significant impact on FPGA parametric yield rate. LUT size of 4 has the highest leakage yield, LUT size of 7 has the highest timing yield, but LUT size of 5 achieves the maximum leakage and timing combined yield.

It has been assumed that the local variation is independent and ignores spatial correlation. It should be appreciated that our variation model can be improved by taking such spatial correlation into account. After which device and architecture evaluation can be performed with the new variation model to determine if the conclusion is different compared to the variation model introduced herein.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

Trace Information, Device and Circuit Parameters

| Trace Parameters (depend on architecture) | |
|---|---|
| $N_i^u$ | # of used type i circuit elements |
| $N_i^t$ | total # of type i circuit elements |
| $S_i^u$ | avg. switching activity for used type i circuit elements |
| $N_i^p$ | # of type i circuit elements on the critical path |
| $\alpha_{sc}$ | ratio between short circuit power and switch power |
| Device Parameters (depend on processing technology and circuit design) | |
| $V_{dd}$ | power supply voltage |
| $V_t$ | threshold voltage |
| $P_i^s$ | avg. leakage power for type i circuit elements |
| $C_i^u$ | avg. load capacitance of type i circuit elements |
| $D_i$ | avg. delay of type i circuit elements |

TABLE 2

Comparison between Analytical Variation Models and Monte Carlo (M-C) Simulation

| Variations(σ) | | | Mean(W) | | SD (%) | |
|---|---|---|---|---|---|---|
| $(L_g, L_l)$ | $(V_g, V_l)$ | $(T_g, T_l)$ | M-C | Model | M-C | Model |
| (±3, 0) | (±3, 0) | (±3, 0) | 1.24 | 1.20 | 14 | 13 |
| (±3, ±1) | (±3, ±1) | (±3, ±1) | 1.41 | 1.37 | 14 | 13 |
| (±3, ±2) | (±3, ±2) | (±3, ±2) | 2.07 | 2.00 | 13 | 12 |

TABLE 3

Comparison of Different Device Settings

| 1 | 2 | 3 | 4 | 5 | 6 | 7 | 8 |
|---|---|---|---|---|---|---|---|
| ITRS $V_{dd}$ 0.80 V/$V_t$ 0.20 V | | | | Min ED $V_{dd}$ 0.90 V/$V_t$ 0.30 V | | | |
| Y (%) | Mean (W) | SD (%) | (N, K) | Y (%) | Mean (W) | SD (%) | (N, K) |
| 70 | 0.4 | 39 | (6, 5) | 97 | 0.07 | 48 | (6, 4) |
| 68 | 0.5 | 40 | (8, 3) | 97 | 0.08 | 48 | (8, 4) |
| 64 | 0.58 | 39 | (10, 3) | 96 | 0.08 | 48 | (10, 4) |
| 61 | 0.55 | 38 | (12, 3) | 96 | 0.08 | 49 | (6, 5) |
| 60 | 0.43 | 64 | (6, 4) | 94 | 0.1 | 48 | (8, 3) |
| 58 | 0.45 | 63 | (8, 4) | 93 | 0.12 | 48 | (10, 3) |
| 55 | 0.47 | 62 | (10, 4) | 92 | 0.11 | 48 | (12, 3) |
| 43 | 0.55 | 34 | (8, 5) | 89 | 0.11 | 49 | (12, 4) |
| 43 | 0.56 | 34 | (10, 5) | 88 | 0.11 | 49 | (8, 5) |
| 42 | 0.6 | 34 | (12, 5) | 87 | 0.11 | 49 | (10, 5) |
| 40 | 0.58 | 37 | (3, 6) | 87 | 0.12 | 48 | (3, 6) |
| 39 | 0.62 | 53 | (12, 4) | 86 | 0.12 | 49 | (12, 5) |
| 37 | 0.71 | 40 | (8, 6) | 78 | 0.15 | 49 | (6, 6) |
| 37 | 0.71 | 40 | (6, 6) | 78 | 0.15 | 49 | (8, 6) |
| 37 | 0.78 | 39 | (10, 6) | 76 | 0.16 | 49 | (10, 6) |
| 36 | 0.82 | 39 | (12, 6) | 75 | 0.17 | 49 | (12, 6) |
| 26 | 0.92 | 47 | (6, 7) | 72 | 0.17 | 49 | (6, 7) |
| 25 | 0.98 | 46 | (8, 7) | 70 | 0.18 | 49 | (8, 7) |
| 25 | 1.32 | 46 | (10, 7) | 68 | 0.25 | 49 | (10, 7) |
| 24 | 1.22 | 44 | (12, 7) | 65 | 0.23 | 49 | (12, 7) |

TABLE 4

Comparison of Leakage Yield Between Classes

| | Homo-$V_t$ | | | | | Hetero-$V_t$ | | | | | | Homo-$V_t$ + G | | | | |
|---|---|---|---|---|---|---|---|---|---|---|---|---|---|---|---|---|
| (N, K) | $V_{dd}$ (V) | $V_t$ (V) | Y (%) | Mean (W) | SD (%) | $V_{dd}$ (V) | $V_t$ (V) | $CV_t$ (V) | $IV_t$ (V) | Y (%) | Mean (W) | SD (%) | $V_{dd}$ (V) | $V_t$ (V) | Y (%) | Mean (W) | SD (%) |
| (6, 4) | 0.9 | 0.3 | 97 | 0.07 | 48 | 0.9 | 0.3 | 0.35 | 99 | 0.06 | 46 | 0.9 | 0.3 | 99 | 0.04 | 48 |
| (8, 4) | 0.9 | 0.3 | 97 | 0.08 | 48 | 0.9 | 0.3 | 0.35 | 99 | 0.06 | 46 | 0.9 | 0.3 | 99 | 0.04 | 48 |
| (10, 4) | 0.9 | 0.3 | 96 | 0.08 | 48 | 0.9 | 0.3 | 0.35 | 98 | 0.06 | 46 | 0.9 | 0.3 | 99 | 0.04 | 48 |
| (12, 4) | 0.9 | 0.3 | 89 | 0.11 | 49 | 0.9 | 0.3 | 0.35 | 96 | 0.08 | 45 | 0.9 | 0.3 | 99 | 0.05 | 48 |
| (6, 5) | 0.9 | 0.3 | 96 | 0.08 | 49 | 0.9 | 0.3 | 0.35 | 98 | 0.06 | 46 | 0.9 | 0.3 | 99 | 0.05 | 48 |
| (8, 5) | 0.9 | 0.3 | 88 | 0.11 | 49 | 0.9 | 0.3 | 0.35 | 95 | 0.08 | 46 | 0.9 | 0.3 | 98 | 0.05 | 48 |
| (10, 5) | 0.9 | 0.3 | 87 | 0.11 | 49 | 0.9 | 0.3 | 0.35 | 95 | 0.08 | 46 | 0.9 | 0.3 | 98 | 0.05 | 48 |
| (6, 6) | 0.9 | 0.3 | 78 | 0.15 | 49 | 0.9 | 0.3 | 0.35 | 86 | 0.11 | 46 | 0.9 | 0.3 | 92 | 0.08 | 48 |
| (8, 6) | 0.9 | 0.3 | 78 | 0.15 | 49 | 0.9 | 0.3 | 0.35 | 85 | 0.12 | 46 | 0.9 | 0.3 | 91 | 0.08 | 48 |
| (6, 7) | 0.9 | 0.3 | 72 | 0.17 | 49 | 0.9 | 0.3 | 0.35 | 77 | 0.14 | 47 | 0.9 | 0.3 | 83 | 0.11 | 48 |
| Avg | 0.9 | 0.3 | 88 | 0.11 | 49 | 0.9 | 0.3 | 0.35 | 93 | 0.08 | 46 | 0.9 | 0.3 | 96 | 0.06 | 48 |

TABLE 5

Timing Yield For Homo-$V_t$ + G.

| | Y 1.1X (%) | Y 1.2X (%) | Mean (ns) |
|---|---|---|---|
| (6, 4) | 69 | 86 | 39.9 |
| (8, 4) | 70 | 86 | 40.7 |
| (10, 4) | 69 | 86 | 41.5 |

TABLE 5-continued

Timing Yield For Homo-$V_t$ + G.

| | Y 1.1X (%) | Y 1.2X (%) | Mean (ns) |
|---|---|---|---|
| (12, 4) | 71 | 88 | 38.3 |
| (6, 5) | 75 | 91 | 36.4 |
| (8, 5) | 74 | 90 | 34.6 |
| (10, 5) | 74 | 90 | 34.7 |
| (6, 6) | 77 | 93 | 30.8 |
| (8, 6) | 78 | 94 | 29.9 |
| (6, 7) | 79 | 95 | 27.7 |
| Avg | 75 | 90 | 35.4 |

TABLE 6

Combined Leakage Delay Yield Between FPGA Classes

| | ITRS | Min-ED | | | |
|---|---|---|---|---|---|
| | Homo-$V_t$ | Homo-$V_t$ | Hetero-$V_t$ | Homo-$V_t$ + G | |
| (N, K) | Y(%) | Y(%) | Y(%) | Y(%) | Area Inc (%) |
| (6, 4) | 71 | 83 | 83 | 86 | 18 |
| (8, 4) | 67 | 81 | 81 | 86 | 14 |
| (10, 4) | 65 | 81 | 81 | 86 | 17 |
| (12, 4) | 48 | 77 | 81 | 87 | 20 |
| (6, 5) | 79 | 85 | 84 | 90 | 14 |
| (8, 5) | 55 | 81 | 86 | 89 | 15 |
| (10, 5) | 55 | 81 | 86 | 89 | 19 |
| (6, 6) | 49 | 77 | 82 | 88 | 15 |
| (8, 6) | 49 | 75 | 80 | 88 | 16 |
| (6, 7) | 45 | 73 | 77 | 86 | 10 |
| Avg | 58 | 79 | 82 | 87 | 16 |

What is claimed is:

1. A computer-implemented method of modeling a field programmable gate array (FPGA) subject to process variation, comprising:
   collecting trace-based architecture information for one device setting of an FPGA;
   obtaining FPGA performance and power distribution for a given set of device parameter values and architectural parameter values based on said trace-based information; and
   evaluating leakage distribution using a processor when obtaining FPGA performance and power distribution information in response to process variation and considering that each element has specific location variations while elements within a die share global variations;

wherein said total leakage is approximated as:

$$I_{chip} \approx \sum_i N_i^u E[I_i] + \alpha_{gating} \sum_i (N_i^t - N_i^u) E[I_i]$$

where $I_{chip}$ is total leakage and $N_i^u$ is number of used circuit elements of resource type i and $\sigma_{gating}$ is average leakage ratio between a power-gated circuit element and a circuit element in normal operation and $E[I_i]$ is expected average leakage for element type i.

2. A method as recited in claim 1, wherein said trace-based information is collected in response to FPGA architecture parameters with a given set of device parameters.

3. A method as recited in claim 2:
wherein said FPGA architecture is configured with parameters selected from parameters comprising: number of used circuit elements of a given type, total number of circuit elements of a given type, switching activity for circuit elements of a given type, number of circuit elements on the critical path or paths of a given type, and ratio between short circuit power and switch power; and
wherein said parameters comprise average values or distributions.

4. A method as recited in claim 2:
wherein said FPGA performance and power distributions are obtained based on device parameters selected from the group of device parameters consisting of: power supply voltage, threshold voltage, leakage power for a circuit element of a given type, load capacitance for a circuit element of a given type, and delay for a circuit element of a given type; and
wherein said parameters are based on either average values or distributions.

5. A method as recited in claim 2:
wherein said FPGA performance and power distribution are obtained based on device parameters selected from the group of device parameters consisting of: power supply voltage, threshold voltage, leakage power distribution for a circuit element of a given type, load capacitance for a circuit element of a given type, and delay for a circuit element of a given type; and
wherein said parameters use either average values or distributions.

6. A method as recited in claim 1, wherein collecting of said trace-based architecture information, comprises:
optimizing the logic for a given benchmark set;
mapping the circuit to a given look-up table (LUT) size;
packing the mapped circuit to a given cluster size;
placing and routing the circuit using a packing, placement and routing tool for FPGAs to obtain chip level delay and area; and
simulating power using a cycle-accurate mechanism to estimate power consumption.

7. A method as recited in claim 1, wherein said modeling is based on dividing information during a hyper-architecture evaluation into architecture-dependent elements and performance-dependent elements.

8. A method as recited in claim 1, wherein said evaluation of leakage includes calculating leakage based on power-gating of unused circuit elements.

9. A method as recited in claim 1, further comprising evaluating timing distribution in response to process variation and considering that each element has unique location variations of $L_{eff}$ while elements within a die share global variations of $L_{eff}$, and wherein $L_{eff}$ is an effective channel length.

10. A method as recited in claim 9:
wherein a probability density function (PDF) of a critical path delay for a given global value of channel length $L_g$, is given by:

$$PDF(D|L_g) = PDF(d_1|L_g) \otimes PDF(d_2|L_g) \otimes \ldots \otimes PDF(d_i|L_g) \otimes \ldots \otimes PDF(d_n)$$

where D is path delay, $d_1$ is the delay of the $1^{st}$ circuit element, $d_2$ is the delay of the $2^{nd}$ circuit element, and $d_i$ is the delay of the i th circuit element in the path.

11. A method as recited in claim 1, further comprising analyzing leakage and timing yield based on benchmarks executed within multiple architecture classes.

12. A method as recited in claim 11, wherein said multiple architecture classes comprise:
Homo-$V_t$ with a conventional FPGA using the same and optimized $V_t$ for both logic blocks and interconnects;
Hetero-$V_t$ which optimizes $V_t$ separately for logic blocks and interconnect; and
Homo-$V_t$+G which is the same as Homo-$V_t$ except that unused logic blocks and interconnect are power-gated.

13. A method as recited in claim 11, further comprising performing device and architecture co-optimization to improve yield rate.

14. A method as recited in claim 11, further comprising creating a model from which leakage yield and timing yield of an FPGA are improved.

15. A method as recited in claim 1, further comprising evaluating total leakage current $I_i$ of circuit elements in resource type i as:

$$I_i = I_n(i) \cdot e^{fi(\Delta L_{eff})} \cdot e^{fi(\Delta V_{th})} \cdot e^{fi(\Delta T_{ox})}$$

where $I_n(i)$ is leakage of a circuit element in resource type i in an absence of variability, is a function that represents an impact of each type of process variation on leakage, $\Delta V_{th}$ is variation in threshold voltage, $\Delta L_{eff}$ is effective channel length, and $\Delta T_{ox}$ is gate oxide thickness.

16. A method as recited in claim 1:
wherein interdependency between L, V, and T is ignored; and
wherein variability of L, V, and T are expressed as:

$$f(L) = -c_{i1} \cdot L \; f(V) = -c_{i2} \cdot V \; f(T) = -c_{i3} T \text{; and}$$

wherein L, V, and T denote, respectively, effective channel length ($\Delta L_{eff}$), is variation in threshold voltage ($\Delta V_{th}$), and as gate oxide thickness $\Delta T_{ox}$ and where $c_{i1}$; $c_{i2}$; $c_{i3}$ are fitting parameters obtained from simulation.

17. A method as recited in claim 1, wherein a variability of L, V, and T are separated during obtaining FPGA performance and power information for local and global components, as $$I_i = I_n(i) \cdot e^{-(c_{i1}L_g + c_{i2}V_g + c_{i3}T_g)} \cdot e^{-(c_{i1}L_l + c_{i2}V_l + c_{i3}T_l)}$$

where L, V and T denote effective channel length, variation in threshold voltage, and gate oxide thickness, respectively, which is decomposed into local ($L_i$; $V_i$; $T_i$) and global ($L_g$; $V_g$; $T_g$) components while $c_{i1}$; $c_{i2}$; $c_{i3}$ are fitting parameters obtained from simulation, and where $I_i$ is total leakage current, $I_n(i)$ is leakage of a circuit element in resource type i absent any variability.

18. A method as recited in claim 1, wherein an expression of chip-level leakage, as determined while obtaining FPGA performance and power information, is given as follows:

$$I_{chip} \approx \sum_i N_i^t \cdot E[I_i]$$

$$= \sum_i N_i^t S_i I_{L_g, V_g, T_g(i)}$$

$$S_i = e^{-(c_{i1}\sigma L_l^2 + c_{i2}\sigma V_l^2 + c_{i3}\sigma T_l^2)}/2$$

$$I_{L_g, V_g, T_g(i)} = I_n(i)e^{-(c_{i1}L_g + c_{i2}V_g + c_{i3}T_g)}$$

where $S_i$ is a scale factor introduced due to local variability in L as effective channel length, Vas variation in threshold, voltage, and T as gate oxide thickness which is decomposed into local $(L_i; V_i; T_i)$ and global $(L_g; V_g; T_g)$ components with value $I_{L_g, V_g, T_g(i)}$ is leakage as a function of global variations, while $\sigma_{L1}$, $\sigma_{V1}$, and $\sigma_{T1}$ are variances of $L_1$, $V_1$, and $T_1$, respectively;

wherein $E[I_i]$ is expected average leakage for element type I, $L_i$ is decomposed effective channel length, $N_i^t$ is total number of type i circuit elements, $N_i^u$ is total number of used circuit elements, while $c_{i1}$; $c_{i2}$; $c_{i3}$ are fitting parameters obtained from simulation.

19. A method as recited in claim 1, wherein total leakage current $I_{chip}$ taking into account power-gated elements is given by:

$$I_{chip} = \sum_i N_i^u I_i + \alpha_{gating} \sum_i (N_i^t - N_i^u) I_i$$

where $N_i^u$ is number of used circuit elements of resource type i, total leakage current $I_i$, $N_i^t$ is total number of type i circuit elements, and $\sigma_{gating}$ is average leakage ratio between a power-gated circuit element and a circuit element in normal operation.

20. A method as recited in claim 1, wherein leakage current variation $I_{chip}$ is extended to consider variations as:

$$I_{chip} \approx \sum_i N_i^u E[I_i] + \alpha_{gating} \sum_i (N_i^t - N_i^u) E[I_i]$$

where $E[I_i]$ is expected average leakage for element type i where $N_i^u$ is number of used circuit elements of resource type i, total leakage current $I_i$, $N_i^t$ is total number of type i circuit elements, $\sigma_{gating}$ is average leakage ratio between a power-gated circuit element and a circuit element in normal operation.

21. A method as recited in claim 1:
wherein timing yield is calculated on a bin-by-bin basis where each bin corresponds to a specific value $L_g$;
wherein it is assumed that delay of each path is independent, wherein timing yield for a given $L_g$ is given as:

$$Y_{perf}(D_{cut} | L_g) = \prod_{i=1}^n CDF_i(D_{cut} | L_g);$$

where $CDF_i(D_{cut|L_g})$ gives probability that delay of the i th longest path is no greater than $D_{cut}$ which is cutoff delay $(D_{cut})$ and $L_g$ is delay considering global variation; and
wherein only a desired number of longest paths are considered.

22. A method as recited in claim 21, wherein performance yield is calculated based on an integral $Y_{perf}(D_{cut}|L_g)$ as, $$Y_{perf} = \int_{-\infty}^{+\infty} PDF(L_g) \cdot Y_{leak}(I_{cut} | L_g) \cdot dL_g$$

where $Y_{perf}$ is performance yield, $Y_{leak}$ is total leakage yield, $I_{cut}$ is a leakage limit, PDF is probability density function, $L_g$ is global channel length, and $D_{cut}$ is path delay limit.

23. A computer-implemented method of modeling a field programmable gate array (FPGA) subject to process variation, comprising:
collecting trace-based architecture information for one device setting of an FPGA;
obtaining FPGA performance and power distribution for a given set of device parameter values and architectural parameter values based on said trace-based information; and
evaluating timing distribution using a processor in response to process variation and considering that each element has unique location variations of $L_{eff}$ while elements within a die share global variations of $L_{eff}$, and wherein $L_{eff}$ is an effective channel length.

24. A method as recited in claim 23:
wherein a probability density function (PDF) of a critical path delay for a given global value of channel length $L_g$, is given by:

$$PDF(D|L_g) = PDF(d_1|L_g) \otimes PDF(d_2|L_g) \otimes \ldots$$
$$\otimes PDF(d_i|L_g) \otimes \ldots \otimes PDF(d_n).$$

where D is path delay, $d_1$ is the delay of the $1^{st}$ circuit element, $d_2$ is the delay of the $2^{nd}$ circuit element, and $d_i$ is the delay of the i th circuit element in the path.

25. A computer-implemented method of modeling a field programmable gate array (FPGA) subject to process variation, comprising:
collecting trace-based architecture information for one device setting of an FPGA;
obtaining FPGA performance and power distribution for a given set of device parameter values and architectural parameter values based on said trace-based information; and
evaluating using a processor total leakage current $I_i$ of circuit elements in resource type i as:

$$I_i = I_n(i) \cdot e^{f_i(\Delta L_{eff})} \cdot e^{f_i(\Delta V_{th})} \cdot e^{f_i(\Delta T_{ox})}$$

where $I_n(i)$ is leakage of a circuit element in resource type i in an absence of variability, f is a function that represents an impact of each type of process variation on leakage, $\Delta V_{th}$ is variation in threshold voltage, $\Delta L_{eff}$ is effective channel length, and $\Delta T_{ox}$ is gate oxide thickness.

26. A computer-implemented method of modeling a field programmable gate array (FPGA) subject to process variation, comprising:
collecting trace-based architecture information for one device setting of an FPGA; and
obtaining using a processor FPGA performance and power distribution for a given set of device parameter values and architectural parameter values based on said trace-based information;
wherein the variability of L, V, and T are separated during obtaining FPGA performance and power information for local and global components, as $$I_i = I_n(i) \cdot e^{-(c_{i1}L_g + c_{i2}V_g + c_{i3}T_g)} \cdot e^{-(c_{i1}L_g + c_{i2}V_i + c_{i3}T_i)};$$

where L, V and T denote effective channel length, variation in threshold, voltage, and gate oxide thickness, respectively, which is decomposed into local ($L_i$; $V_i$; $T_i$) and global ($L_g$; $V_g$; $T_g$) components while $c_{i1}$; $c_{i2}$; $c_{i3}$ are fitting parameters obtained from simulation, and where $I_i$ is total leakage current, $I_n(i)$ is leakage of a circuit element in resource type i absent any variability.

27. A computer-implemented method of modeling a field programmable gate array (FPGA) subject to process variation, comprising:
   collecting trace-based architecture information for one device setting of an FPGA; and
   obtaining using a processor, FPGA performance and power distribution for a given set of device parameter values and architectural parameter values based on said trace-based information;
   wherein an expression of chip-level leakage, as determined while obtaining FPGA performance and power information, is given as follows:

$$I_{chip} \approx \sum_i N_i^t \cdot E[I_i]$$

$$= \sum_i N_i^t S_i I_{L_g, V_g, T_g(i)}$$

$$S_i = e^{-(c_{i1}\sigma L_i^2 + c_{i2}\sigma V_i^2 + c_{i3}\sigma T_i^2)/2}$$

$$I_{L_g, V_g, T_g(i)} = I_n(i) e^{-(c_{i1}L_g + c_{i2}V_g + c_{i3}T_g)}$$

where $S_i$ is a scale factor introduced due to local variability in L as effective channel length, Vas variation in threshold, voltage, and T as gate oxide thickness which is decomposed into local ($L_i$; $V_i$; $T_i$) and global ($L_g$; $V_g$; $T_g$) components with value $I_{L_g, V_g, T_g(i)}$ is leakage as a function of global variations, while $\sigma_{L1}$, $\sigma_{V1}$, and $\sigma_{T1}$ are variances of $L_1$, $V_1$, and $T_1$, respectively;
   wherein $E[I_i]$ is expected average leakage for element type i, $L_i$ is decomposed effective channel length, $N_i^t$ is total number of type i circuit elements, $N_i^u$ is total number of used circuit elements, while $c_{i1}$; $c_{i2}$; $c_{i3}$ are fitting parameters obtained from simulation.

28. A computer-implemented method of modeling a field programmable gate array (FPGA) subject to process variation, comprising:
   collecting trace-based architecture information for one device setting of an FPGA; and
   obtaining using a processor, FPGA performance and power distribution for a given set of device parameter values and architectural parameter values based on said trace-based information;
   wherein total leakage current $I_{chip}$ is determined during said obtaining FPGA performance and power distribution, in response to power-gated elements given by:

$$I_{chip} = \sum_i N_i^u I_i + \alpha_{gating} \sum_i (N_i^t - N_i^u) I_i$$

where $N_i^u$ is number of used circuit elements of resource type i, total leakage current $I_i$, $N_i^t$ is total number of type i circuit elements, and $\sigma_{gating}$ is average leakage ratio between a power-gated circuit element and a circuit element in normal operation.

29. A computer-implemented method of modeling a field programmable gate array (FPGA) subject to process variation, comprising:
   collecting trace-based architecture information for one device setting of an FPGA; and
   obtaining FPGA performance and power distribution using a processor for a given set of device parameter values and architectural parameter values based on said trace-based information;
   wherein leakage current variation $I_{chip}$ is determined during said obtaining FPGA performance and power distribution, in response to variations as:

$$I_{chip} \approx \sum_i N_i^u E[I_i] + \alpha_{gating} \sum_i (N_i^t - N_i^u) E[I_i]$$

where $E[I_i]$ is expected average leakage for element type i, where $N_i^u$ is number of used circuit elements of resource type i, total leakage current $I_i$, $N_i^t$ is total number of type i circuit elements, $\sigma_{gating}$ is average leakage ratio between a power-gated circuit element and a circuit element in normal operation.

30. A computer-implemented method of modeling a field programmable gate array (FPGA) subject to process variation, comprising:
   collecting trace-based architecture information for one device setting of an FPGA; and
   obtaining FPGA performance and power distribution using a processor for a given set of device parameter values and architectural parameter values based on said trace-based information;
   wherein timing yield is calculated on a bin-by-bin basis during said obtaining FPGA performance and power distribution, where each bin corresponds to a specific value $L_g$;
   wherein it is assumed that delay of each path is independent, wherein timing yield for a calculated $L_g$ is given as:

$$Y_{perf}(D_{cut} | L_g) = \prod_{i=1}^{n} CDF_i(D_{cut} | L_g);$$

where $CDF_i(D_{cut}|L_g)$ gives probability that delay of i th longest path is no greater than $D_{cut}$ which is cutoff delay ($D_{cut}$) and $L_g$ is delay considering global variation; and
   wherein only a desired number of longest paths are considered.

31. A method as recited in claim 30, wherein performance yield is calculated based on an integral $Y_{perf}(D_{cut}|L_g)$ as, $$Y_{perf} = \int_{-\infty}^{+\infty} PDF(L_g) \cdot Y_{leak}(I_{cut} | L_g) \cdot dL_g$$

where $Y_{perf}$ is performance yield, $Y_{leak}$ is total leakage yield, $I_{cut}$ is a leakage limit, PDF is probability density function, $L_g$ is global channel length, and $D_{cut}$ is path delay limit.

* * * * *